(12) United States Patent
Stone

(10) Patent No.: US 7,214,027 B2
(45) Date of Patent: May 8, 2007

(54) WAFER HANDLER METHOD AND SYSTEM

(75) Inventor: Stanley W. Stone, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 389 days.

(21) Appl. No.: 10/687,023

(22) Filed: Oct. 16, 2003

(65) Prior Publication Data

US 2005/0095090 A1    May 5, 2005

(51) Int. Cl.
B65G 1/04 (2006.01)
B65G 49/07 (2006.01)

(52) U.S. Cl. .................. 414/805; 414/217; 414/939

(58) Field of Classification Search .......... 414/805, 414/806, 217, 936, 939
See application file for complete search history.

(56) References Cited

U.S. PATENT DOCUMENTS

| | | | | |
|---|---|---|---|---|
| 4,718,975 A | * | 1/1988 | Bowling et al. | 204/298.11 |
| 4,927,484 A | | 5/1990 | Mitomi | 156/345 |
| 5,474,410 A | | 12/1995 | Ozawa et al. | 414/217 |
| 5,486,080 A | * | 1/1996 | Sieradzki | 414/217 |
| 5,564,889 A | * | 10/1996 | Araki | 414/806 |
| 6,315,512 B1 | * | 11/2001 | Tabrizi et al. | 414/217 |
| 6,368,051 B2 | * | 4/2002 | Raaijmakers | 414/805 |
| 6,481,956 B1 | * | 11/2002 | Hofmeister | 414/806 |
| 6,918,731 B2 | * | 7/2005 | Talmer | 414/217 |
| 2001/0014267 A1 | * | 8/2001 | Yamaga et al. | 414/217 |

FOREIGN PATENT DOCUMENTS

WO    WO 01/78114 A1    10/2001

* cited by examiner

Primary Examiner—Charles A. Fox
(74) Attorney, Agent, or Firm—Foley Hoag LLP

(57) ABSTRACT

Systems and methods for handling wafers include retrieving a first wafer from a wafer cassette using a first arm, transferring the first wafer from the first transfer arm to a second arm, delivering the first wafer for processing to a process chamber using the second arm, removing the first wafer from the process chamber using the first arm, and returning the first wafer to the cassette using the first arm. The systems and methods can include retrieving a first wafer from a wafer cassette using a first arm, delivering the first wafer for processing to a process chamber using the first arm, removing a processed wafer from the process chamber using a second arm, returning the processed wafer to the cassette using the second arm, and iteratively retrieving, delivering, removing and returning wafers from the cassette while alternating arms between iterations.

37 Claims, 20 Drawing Sheets

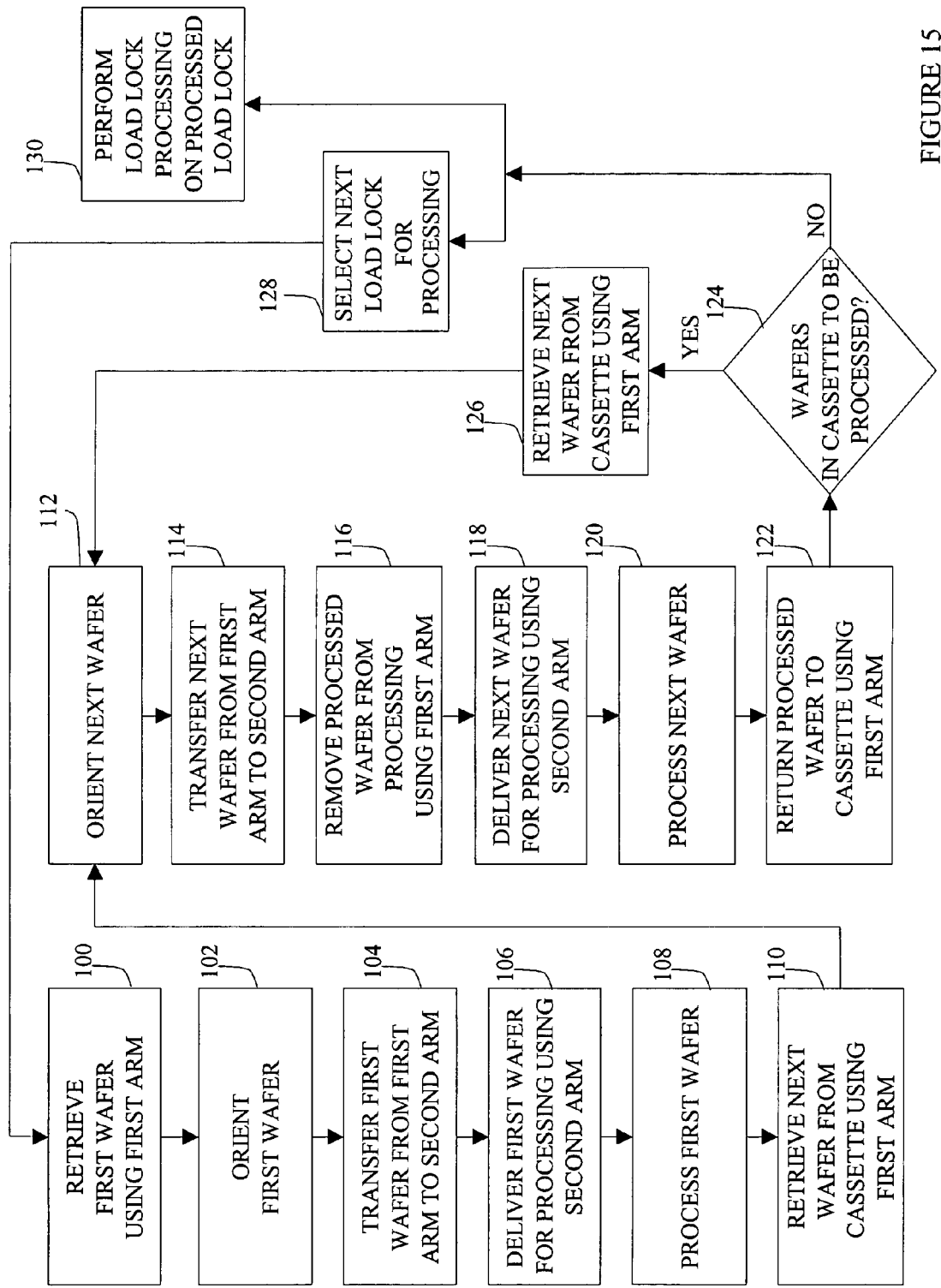

WAFER HANDLER METHOD AND SYSTEM

BACKGROUND (1) Field

The disclosed methods and systems relate generally to semiconductor processing, and more particularly to wafer handling methods and systems.

(2) Description of Relevant Art

Some challenges of semiconductor manufacturing include providing a manufacturing process that produces reduced process defects with increased process throughput. These manufacturing concerns can also be balanced with other requirements that include a need for reduced contamination.

FIG. 18 provides one semiconductor wafer processing system 10 where, for example, a cassette of semiconductor wafers ("wafers") can be presented to left and right load locks 12, 14 to allow wafer transfers to a processing chamber 16 such as, for example, an ion implantation chamber. The load locks 12, 14 can be understood to be an interface between a loading station and the processing chamber 16. Because the wafers can be loaded from a loading station that may often be at atmospheric pressure, once the wafers are presented to the load locks 12, 14, the lock loads 12, 14 can be isolated from the loading station and the processing chamber 16. A load lock vacuum pump, for example, can thus reduce the load lock pressure, or "evacuate" a respective load lock 12, 14, in accordance with, or to be consistent with the processing chamber pressure.

Wafers from the cassettes in the left and right load locks 12, 14 can be processed in turn, alternating between left and right load locks 12, 14. Accordingly, in a system according to FIG. 18, the left and right load locks 12, 14 can be substantially simultaneously evacuated and thereafter opened or otherwise interfaced to the processing chamber 16. For exemplary purposes, a left arm 18 can retrieve a wafer from the left load lock cassette, and present the retrieved wafer to a left orienter 20 that can locate a wafer notch to align the wafer center with the orienter axis of centricity. The left arm 18 can thereafter deliver the wafer to a platen 22 in the process chamber 16, and thereafter, the left arm 18 can be displaced to allow wafer processing. Once the wafer is processed, the left arm 18 can deliver the wafer from the platen 22 to the left orienter 20 and hence to the left load lock cassette. As FIG. 18 indicates, a wafer from the right load lock cassette can be retrieved by a right robot 24 and placed on a right orienter 26 before being delivered to the platen 22 for processing. Such wafer can also be returned to the right load lock 14 after processing is complete. As provided previously herein, throughput for a system according to FIG. 18 can be improved by coordinating the alternating delivery of wafers from the left and right load lock cassettes to reduce delay between deliveries to the platen 22.

For a system according to FIG. 18, once the wafers from the left and right load lock cassettes are processed and returned to the load lock cassettes, the load locks 12, 14 can be isolated from the processing chamber 16 to allow a substantially simultaneous venting of the load locks 12, 14 and a return to a pressure according to, or otherwise consistent with the loading station pressure. The interfaces between the respective load locks 12, 14 and the loading station(s) can then be opened to allow transfer of the left and right cassettes in accordance with a processing methodology.

Batch vacuum load locks such as those according to FIG. 18 can experience poor cycle time because the larger volume of a batch load lock can present a longer evacuation time, during which wafers are being processed from neither the left nor right load locks 12, 14.

SUMMARY

The systems and methods disclosed herein can include wafer handling methods and systems for retrieving wafers from a storage position, delivering the wafers to a process chamber and returning the processed wafers to the storage position a method for handling wafers can include retrieving a first wafer from a wafer cassette using a first arm, transferring the first wafer from the first arm to a second arm, delivering the first wafer for processing using the second arm so as to generate a processed wafer, removing the processed wafer from processing using the first arm and returning the processed wafer to the storage position using the first arm.

The method can include delivering the first wafer using the second arm while retrieving a next wafer from the storage position using the first arm. The first wafer can be oriented prior to being transferred. The method can further include processing the first wafer in the process chamber, wherein processing can include performing photoresist, dry etch, ion implantation, chemical deposition, and/or diffusion. Processing can also include orienting the next wafer and/or transferring the next wafer from the first arm to the second arm.

The storage position can be a wafer cassette and retrieving the first wafer or returning the processed wafer can include indexing the cassette.

Returning the processed wafer using the first arm can include delivering the next wafer for processing using the second arm or placing the second arm in a standby position. Transferring the wafers between arms can include aligning the first arm and the second arm to facilitate the transfer. Transferring can include controlling an orienter to transfer the first wafer from the first arm to the second arm.

In another embodiment a method for handling wafers can include retrieving a first wafer from a wafer cassette using a first arm, transferring the first wafer from the first arm to a second arm, delivering the first wafer for processing using the second arm while retrieving a distinct next wafer from the wafer cassette using the first arm, processing the first wafer to generate a processed wafer, while transferring the next wafer from the first arm to the second arm, removing the processed wafer from processing using the first arm and delivering the next wafer for processing using the second arm while returning the processed wafer to the cassette using the first arm.

The method can include retrieving a distinct next wafer from the cassette using the first arm while processing the next wafer, and iteratively performing the processing, removing, and delivering. Processing can include performing photoresist, dry etch, ion implantation, chemical deposition, and/or diffusion. Transferring can include controlling an orienter to transfer the first wafer between the first arm and the second arm. Retrieving can include indexing the cartridge.

In a further embodiment, a method for processing wafers from two or more load locks can include processing wafers from a first wafer cassette in a first load lock, where the wafers are delivered for processing from the first wafer cassette using two arms, performing load lock processing for at least a second load lock to obtain a processed load lock while processing the wafers of the first wafer cassette, completing the processing of the first wafer cassette and processing wafers from a second wafer cassette in the processed load lock, where the wafers are delivered for processing from the second wafer cassette using two arms. The method can include performing load lock processing of the first load lock upon completion of processing of the first wafer cassette. Additionally, the method can include performing load lock processing of the first load lock upon completion of processing of the first wafer cassette, completing the processing of the second wafer cassette and processing wafers from a replacement wafer cassette in the first load lock, where the wafers are delivered for processing from the replacement wafer cassette using two arms. Performing load lock processing can include evacuating, venting, isolation, cassette removal, cassette replacement, cassette installation, and/or lock valve control.

In one embodiment a system for handling wafers can include a first arm for handling wafers, a distinct second arm for handling wafers, a first cassette of wafers and a wafer processing system.

The wafers can be delivered to the processing system from the first cassette using the first arm and the second arm, and the delivery can include individually retrieving a first wafer from the cassette using the first arm, transferring the first wafer from the first arm to the second arm, delivering the first wafer for processing by the wafer processing system using the second arm, processing the first wafer to generate a processed wafer, while retrieving a next wafer from the cassette using the first arm, transferring the next wafer to the second arm, removing the processed wafer using the first arm and delivering the next wafer for processing using the second arm, processing the next wafer to generate a processed wafer while returning the processed wafer to the cassette and iteratively performing the processing, transferring, removing, and processing to process the wafers in the cassette.

The system can include a first load lock for the first cassette, an orienter for orienting the wafers before processing and transferring the wafers between the first arm and the second arm and a platen for retrieving wafers from the second arm for delivering the wafers, and transferring processed wafers to the first arm for removing the processed wafers.

In a further embodiment a method for handling wafers can include retrieving a next wafer from a selected cassette using a first arm, transferring the next wafer to a second arm, removing a processed wafer from a process system using the first arm, delivering the next wafer to the process system using the second arm and returning the processed wafer to the selected cassette using the first arm.

In one aspect, the method can iteratively return to retrieving. Transferring can include using an orienter to transfer the next wafer. The processed wafer can be oriented before returning the processed wafer and a cassette can be selected prior to retrieving. The method can determine whether unprocessed wafers remain in the selected cassette, and, based on the determination, can select a new cassette and iteratively return to retrieving, and/or perform load lock processing associated with the processed cassette.

In one embodiment, a method for handling wafers can include retrieving a next wafer from a storage position using a first arm, removing a processed wafer from processing using a second arm, delivering the next wafer for processing, returning the processed wafer to the storage position, and iteratively performing the retrieving, delivering and returning while alternating using the first arm and the second arm between iterations. Returning can include returning while processing the next wafer in a process chamber. Processing can include performing at least one of photoresist, dry etch, ion implantation, chemical deposition, and diffusion. The method can include orienting the next wafer prior to delivering the next wafer. The storage position can be a wafer cassette, and retrieving and returning the processed wafer to the cassette can include indexing the cassette. Returning the processed wafer to the storage position using the second arm can include placing the first arm in a standby position.

In one embodiment, a method for handling wafers can include retrieving a first wafer from a wafer cassette using a first arm while removing a processed wafer from processing using a second arm, delivering the first wafer for processing, returning the processed wafer to the wafer cassette while processing the first wafer to generate a processed wafer, retrieving a next wafer from the wafer cassette using the second arm while removing the processed wafer from processing using the first arm, delivering the next wafer for processing, returning the processed wafer to the wafer cassette while processing the next wafer to generate a next processed wafer, and iteratively performing the retrieving, delivering and returning while alternating using the first arm and the second arm between iterations. The method can include orienting the first wafer prior to delivering the first wafer, and orienting the next wafer prior to delivering the next wafer. Retrieving can include indexing the cassette. Delivering the first and next wafers can include processing the first and next wafers in a process chamber and processing can include performing at least one of photoresist, dry etch, ion implantation, chemical deposition, and diffusion.

In one embodiment, a system for handling wafers can include a first arm for handling wafers, a distinct second arm for handling wafers, a first cassette of wafers, and a wafer processing system, where wafers are delivered to the processing system from the first cassette using the first arm and the second arm, and where the delivery includes, individually retrieving a first wafer from the cassette using the first arm, delivering the first wafer for processing by the wafer processing system using the first arm, returning a processed wafer to the cassette using a second arm while processing the first wafer to generate a processed wafer, retrieving a next wafer from the cassette using the second arm, removing the processed wafer using the first arm and delivering the next wafer for processing using the second arm, processing the next wafer to generate a processed wafer while returning the processed wafer to the cassette, and iteratively performing the retrieving, delivering, returning, retrieving, removing, and processing to process the wafers in the cassette.

The system can include a first load lock for the first cassette and an orienter for orienting the wafers before processing. The system can include a platen for retrieving wafers from the first and second arms for processing the wafers, and transferring processed wafers to the first and second arms for removing the processed wafers. The system can include at least one carriage for moving the first and second arms relative to the cassette for returning and retrieving wafers from the cassette.

Other objects and advantages will become apparent hereinafter in view of the specification and drawings.

BRIEF DESCRIPTION OF THE DRAWINGS

FIG. 15 illustrates a block diagram for one disclosed system and method;

DESCRIPTION

Figure 1:
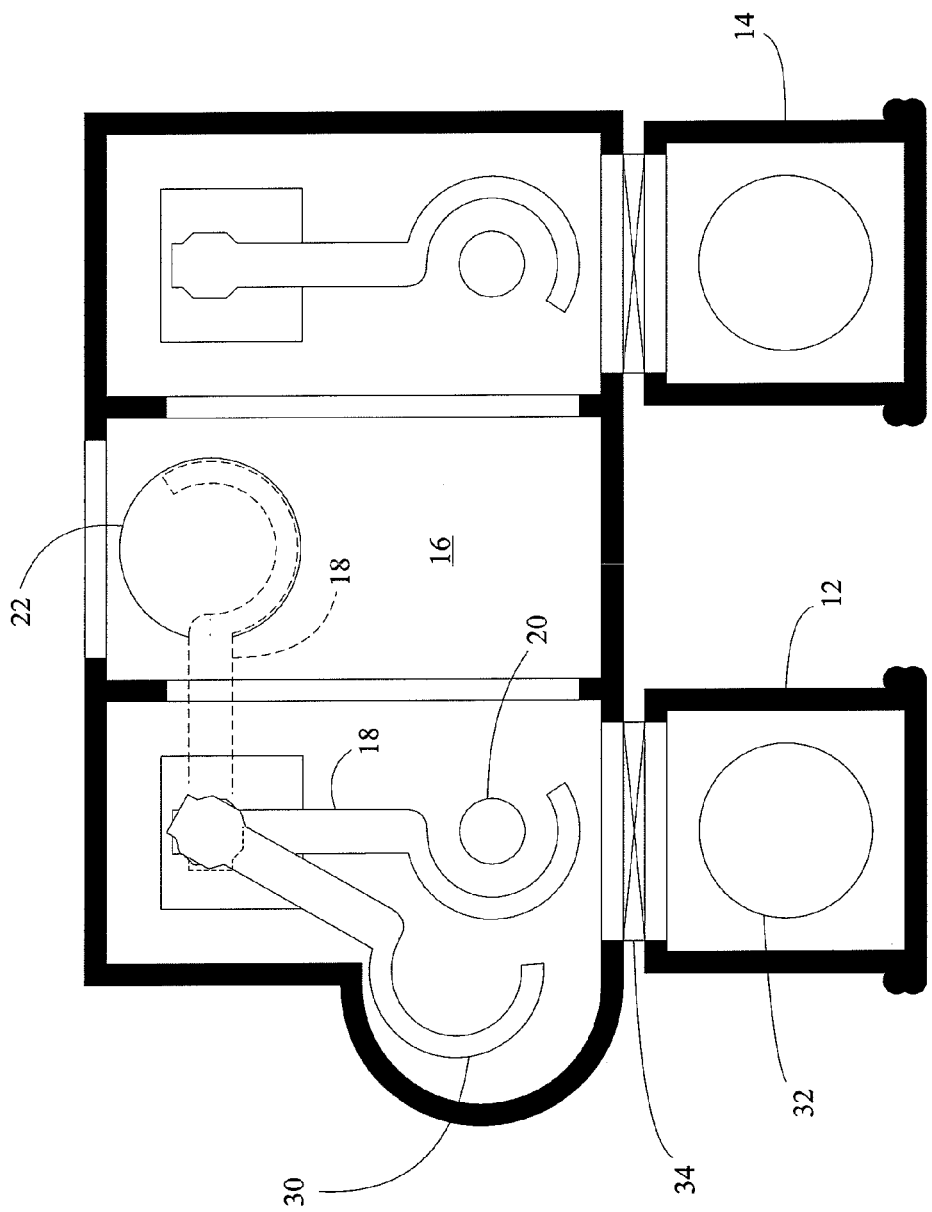
FIG. 1 illustrates a system that includes a first and second arm for handling wafers.

To provide an overall understanding, certain illustrative embodiments will now be described; however, it will be understood by one of ordinary skill in the art that the systems and methods described herein can be adapted and modified to provide systems and methods for other suitable applications and that other additions and modifications can be made without departing from the scope of the systems and methods described herein.

Unless otherwise specified, the illustrated embodiments can be understood as providing exemplary features of varying detail of certain embodiments, and therefore, unless otherwise specified, features, components, modules, and/or aspects of the illustrations can be otherwise combined, separated, interchanged, and/or rearranged without departing from the disclosed systems or methods. Additionally, the shapes and sizes of components are also exemplary and unless otherwise specified, can be altered without affecting the disclosed systems or methods.

The disclosure includes wafer handling methods and systems for retrieving wafers from a wafer cassette in a load lock, delivering the wafers to a process chamber, and returning the processed wafers to the cassette. The methods and systems include a first arm and a second arm that can be coordinated to perform the retrieval, delivery, and return of wafers to allow wafers from the same cassette and/or load lock to be sequentially processed. As provided herein, sequential processing is not to be understood as implying an order of retrieval from the cassette.

Accordingly, for the disclosed methods and systems, a first arm for handling wafers can be understood to be a robotic or other mechanical, electrical, and/or electromechanical arm that may be capable of handling wafers as provided herein. The first arm can be of varying shape such as c-shaped, u-shaped, or another shape, and the methods and systems herein are not limited by a type and/or shape of arm, or a method or system by which the arm may be controlled. The methods and systems also include a second arm. Although the illustrated embodiments indicate that the second arm can be the same as the first arm, one of ordinary skill will recognize that the first arm and the second arm can have a different shape, structure, components, and methods, and may have a different controller from the first arm, although in an embodiment where different controllers may be used, such first arm and second arm controllers can be coordinated to provide a method and system as provided herein.

Although the figures presented herein illustrate two load locks referred to as left and right load locks 12, 14, the disclosed methods and systems are not so limited, and include methods and systems with one or more load locks. Further, it can be understood that for the illustrated embodiments that indicate two load locks and where the methods and systems are described relative to the left load lock 12, such methods and systems can also be applied to the right load lock 14.

FIG. 1 shows one embodiment according to the disclosed methods and systems for handling wafers that includes left and right load locks 12, 14. As provided herein, the methods and systems will be described relative to the left load lock 12 with the understanding that the methods and systems can be applied to the right load lock 14. The Figures illustrate positions that may be engaged by a first arm 18 and a second arm 30 that can access the left load lock 12. As will be provided herein, the first arm 18 can be positioned in positions that include at least a load lock position to allow the first arm 18 to retrieve and/or return a wafer from/to the cassette 32 in the left load lock 12, an orienter position to allow the first arm 18 to interface with at least an orienter 20, and a process position to allow the first arm 18 to retrieve a wafer from a process chamber 16. Those of ordinary skill will recognize that the methods and systems can be applied to various process systems for delivering wafers to process chambers that perform, for example, at least one of photoresist, dry etch, ion implantation, chemical deposition, and diffusion, although such examples are provided for illustration and not limitation, and other processing can be performed in the process chamber 16. Although the illustrated embodiments indicate the use of wafer cassette 32, one of ordinary skill will recognize that other wafer storages means that that can present wafers for retrieval from a storage position such as a load lock can be employed and that the systems and methods described herein can be adapted for use therewith.

The second arm 30 can be positioned in positions that include at least a standby position to allow the second arm 30 to not interfere with processing of a wafer or with the first arm's interaction with the orienter 20, an orienter position to allow the second arm 30 to interface with at least the orienter 20, and a process position to allow the second arm 30 to deliver a wafer to the process chamber 16. Accordingly, based on an embodiment, a standby position and an orienter position may be the same position for the second arm 30. One of ordinary skill thus recognizes that unlike the other arm positions described herein that can be based on, for example, the orienter, the load lock, and a platen, the standby position is not so defined and may include a number of positions, including other defined positions.

It can thus be recognized that the first arm 18 and the second arm 30 include orienter positions and process chamber positions, and as provided herein, vertical transfers of wafers between the first arm 18 and the second arm 30 can be performed while such arms 18, 30 may be maintained in such positions. Accordingly, the first arm 18 and the second arm 30 can be arranged to allow a distance that facilitates independent operation when vertically aligned, while recognizing that a reduced vertical distance between the first and second arms 18, 30 may reduce processing time to transfer wafers between the same. Although such vertical distance between such arms 18, 30 can thus vary based on system characteristics, in one embodiment, when vertically aligned, the first and second arms 18, 30 can be separated by less than approximately five-eights to one-half of one inch.

Returning again to FIG. 1, one of ordinary skill may recognize that the chamber 16 is shown to be enlarged to accommodate the second arm 30 which may be understood to be illustrated in one of the aforementioned standby positions. It can be understood that such enlargement of the process chamber 16 is optional, and in some embodiments, such enlargement may not be necessary to accommodate one or more standby positions for the second arm 30.

As one of ordinary skill in the art also recognizes, the cassette 32 can be introduced to the load lock 12 via a loading station, where the load lock can be isolated from the loading station and the process chamber 16 to allow the load lock pressure to be altered according to (e.g., to be consistent with) the pressure in the process chamber 16. For example, a vacuum or other pressure device can lower the pressure in the load lock. Once the load lock pressure is sufficiently altered, a valve 34 or other mechanism can be altered to allow at least the first arm 18 from the process chamber 16 to access the load lock 12, and specifically, wafers included in the cassette 32.

Figure 2:
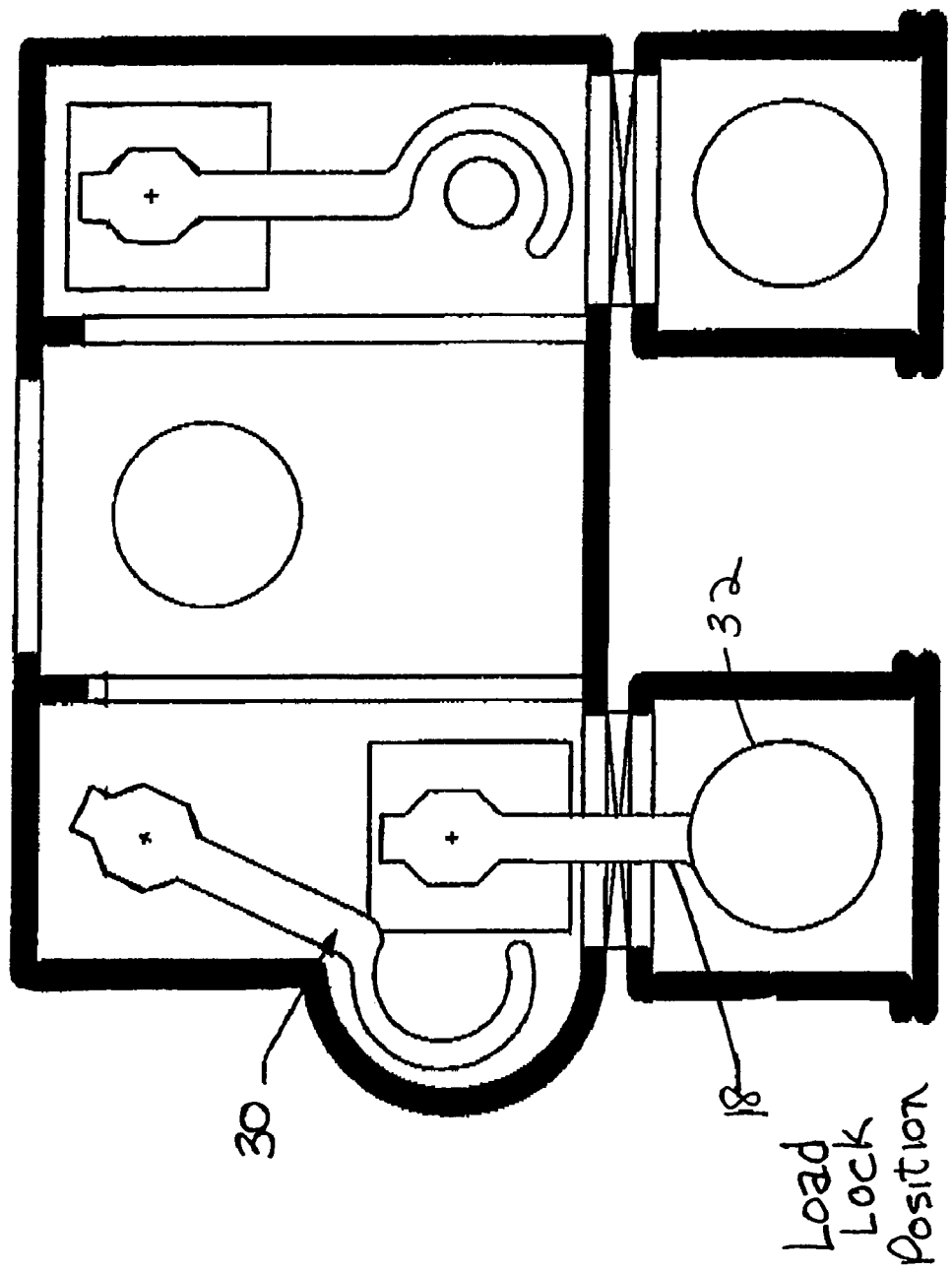
FIG. 2 illustrates a first arm in a load lock retrieval position, with a second arm in a standby position.

It may thus be understood that the cassette can include one or more wafers, but in an illustrative example, can include approximately twenty-five to fifty wafers. Referring to FIG. 2, the first arm 18 can thus be configured to access wafers in the cassette 32 to allow the first arm 18 to retrieve a wafer. Those of ordinary skill will recognize that the cassette 32 may be controlled and/or indexed and such control and/or indexing may be coordinated with the operation of the first arm 18 to facilitate retrieval of a wafer. FIG. 2 illustrates the second arm 30 in a standby mode, and although such may be the case for an initial wafer retrieved from a cassette 32, as provided herein, for subsequent wafer retrievals, the second arm 30 may not be positioned in a standby mode. Furthermore, the second arm 30 may be in another "standby" position, such as in the orienter position.

Figure 3:
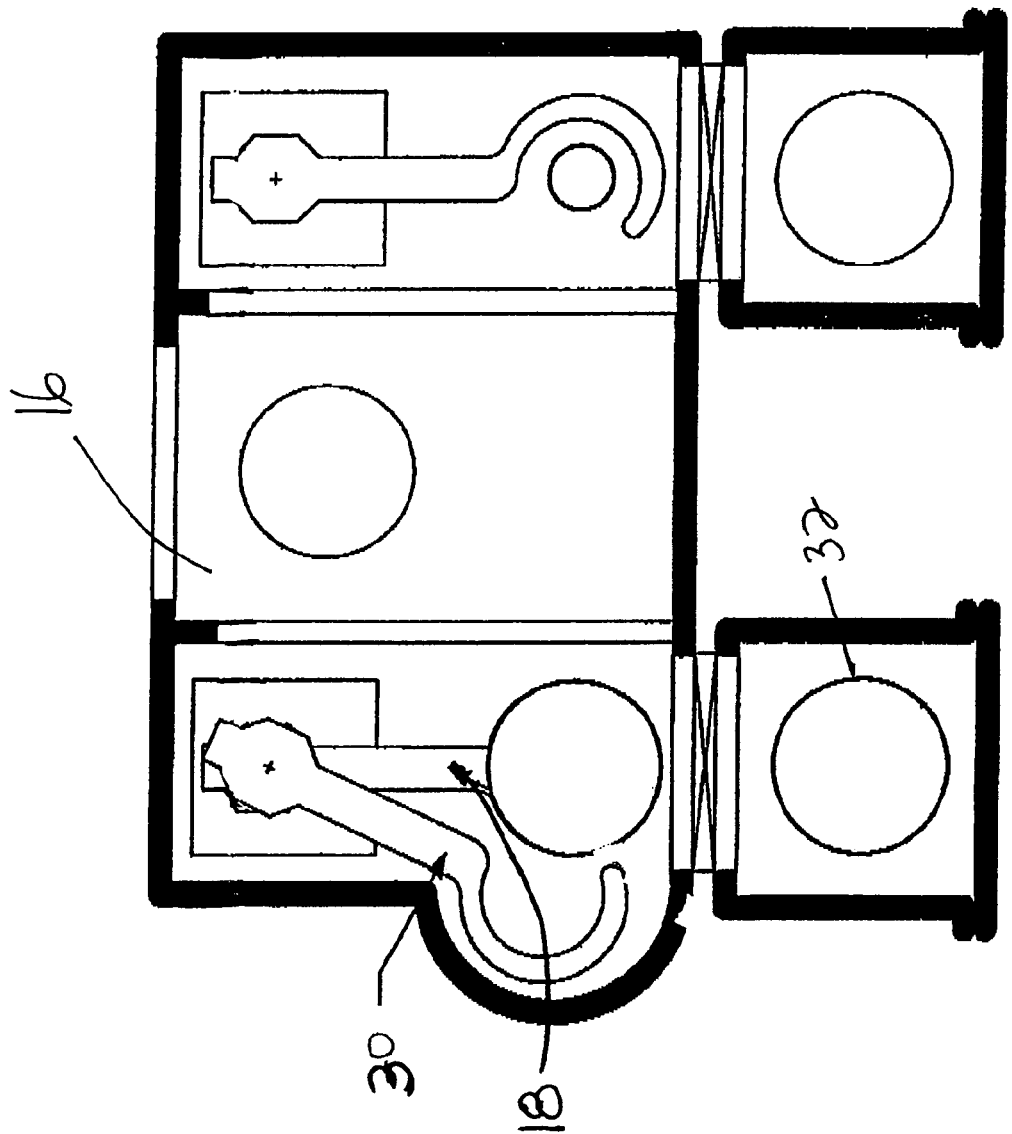
FIG. 3 illustrates the first arm in an orienter position, with the second arm in a standby position.

FIG. 3 presents the first arm 18 in the orienter position to allow the retrieved wafer to be oriented for processing. Those of ordinary skill in the art will recognize that the orienter 20 can be controlled or otherwise operated in the illustrated systems to allow for the orienter 20 to be vertically aligned with at least the first arm 18 when the first arm 18 is in the orienter position, and accordingly, the orienter 20 can be adjusted as needed to interface with the first arm 18 to allow orientation of the wafer. At such time, the second arm 30 may be in a standby position, although as provided herein, the second arm 30 may be in another position such as the orienter position.

Figure 4:
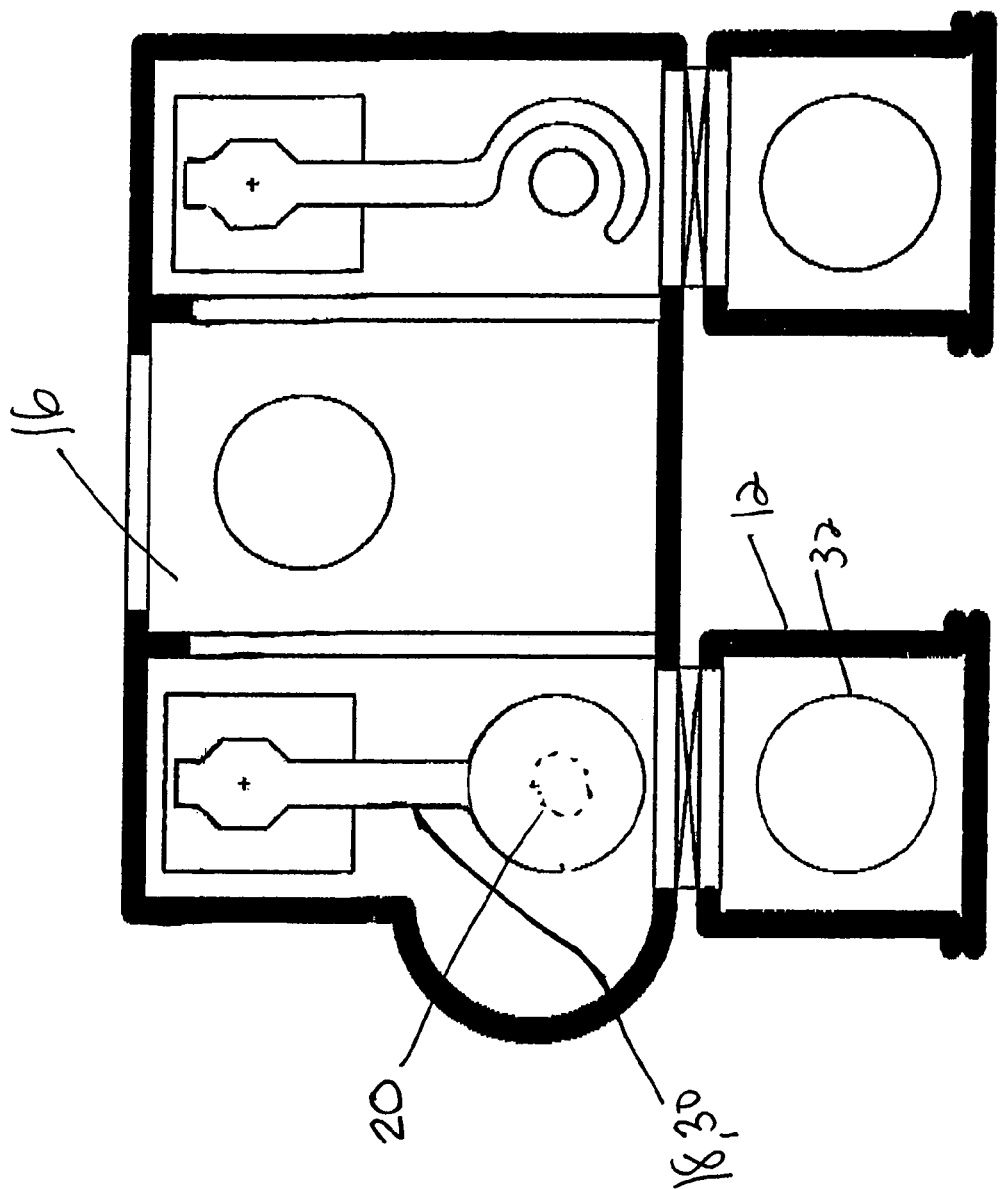
FIG. 4 illustrates the first and second arms in the orienter positions for a delivery of an initial wafer for processing.

Referring to FIG. 4, the orienter 20 can facilitate a transfer of the wafer from the first arm 18 to the second arm 30, where such first and second arms 18, 30 can be vertically aligned to allow such transfer by the orienter 20. Accordingly, the illustrated orienter 20 can be controlled for vertical displacement. It may be recognized that the vertical alignment of the first and second arms 18, 20 can be performed at a time prior to the transfer of the wafer by the orienter 20, and the disclosed methods and systems are not limited by the moment and/or timing of the alignment unless otherwise provided herein. Accordingly, the alignment may occur during orientation, or the alignment may occur prior to wafer orientation.

Figure 5:
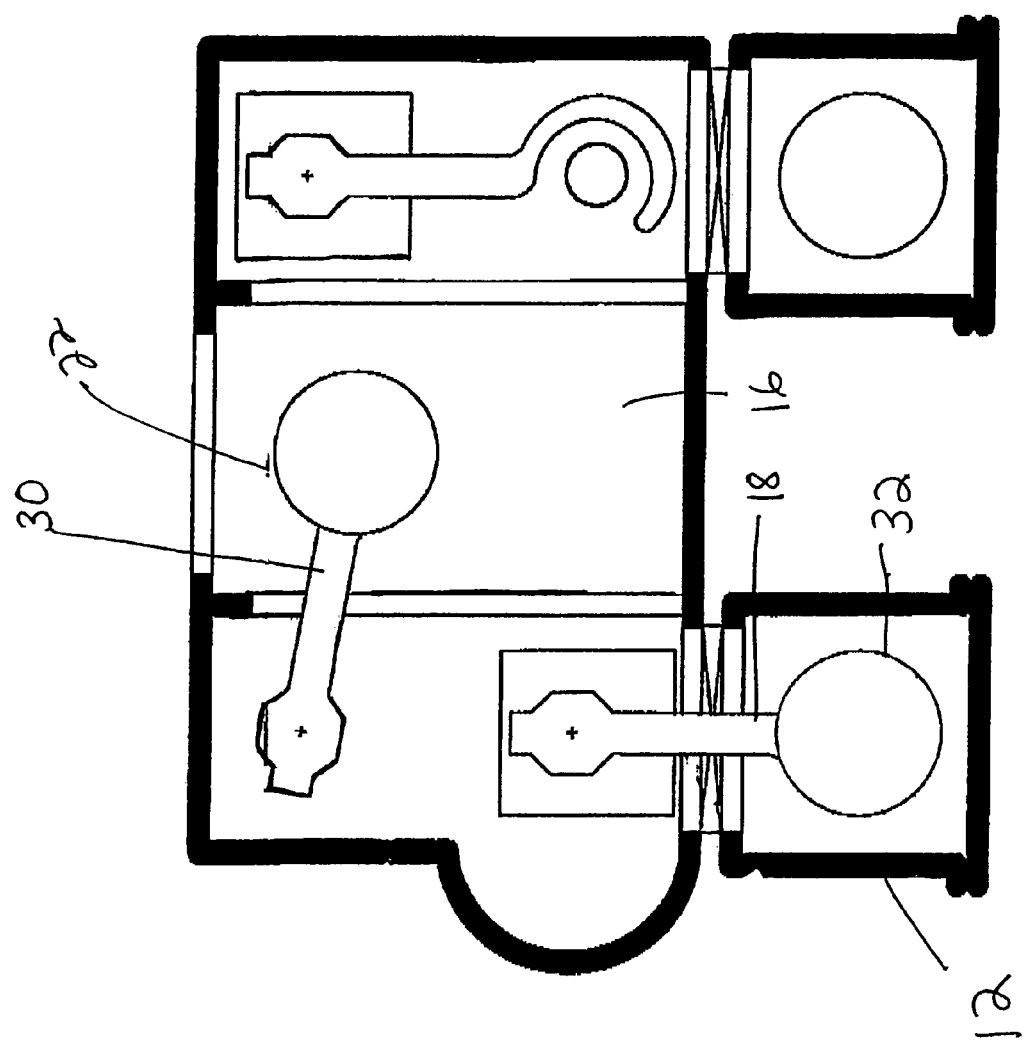
FIG. 5 illustrates the first arm in a load lock retrieval position, with the second arm in a process position.

FIG. 5 shows a delivery of the wafer by the second arm 30 for processing, where in the illustrated systems, the processing area can be a platen 22. As FIG. 5 also illustrates, as the second arm 30 is in the process position, the first arm 18 can be in a load lock position to retrieve a second (or "next") wafer from the cassette 32. Accordingly, the cassette 32 can be controlled or indexed in association with the first arm 18 to allow the first arm's 18 retrieval of the next wafer.

For the discussion herein, the "next" wafer can be understood to the be next wafer retrieved for processing, and will be referred to as the "next" wafer until the wafer is processed, whereupon such wafer can be referred to as the processed wafer.

Figure 6:
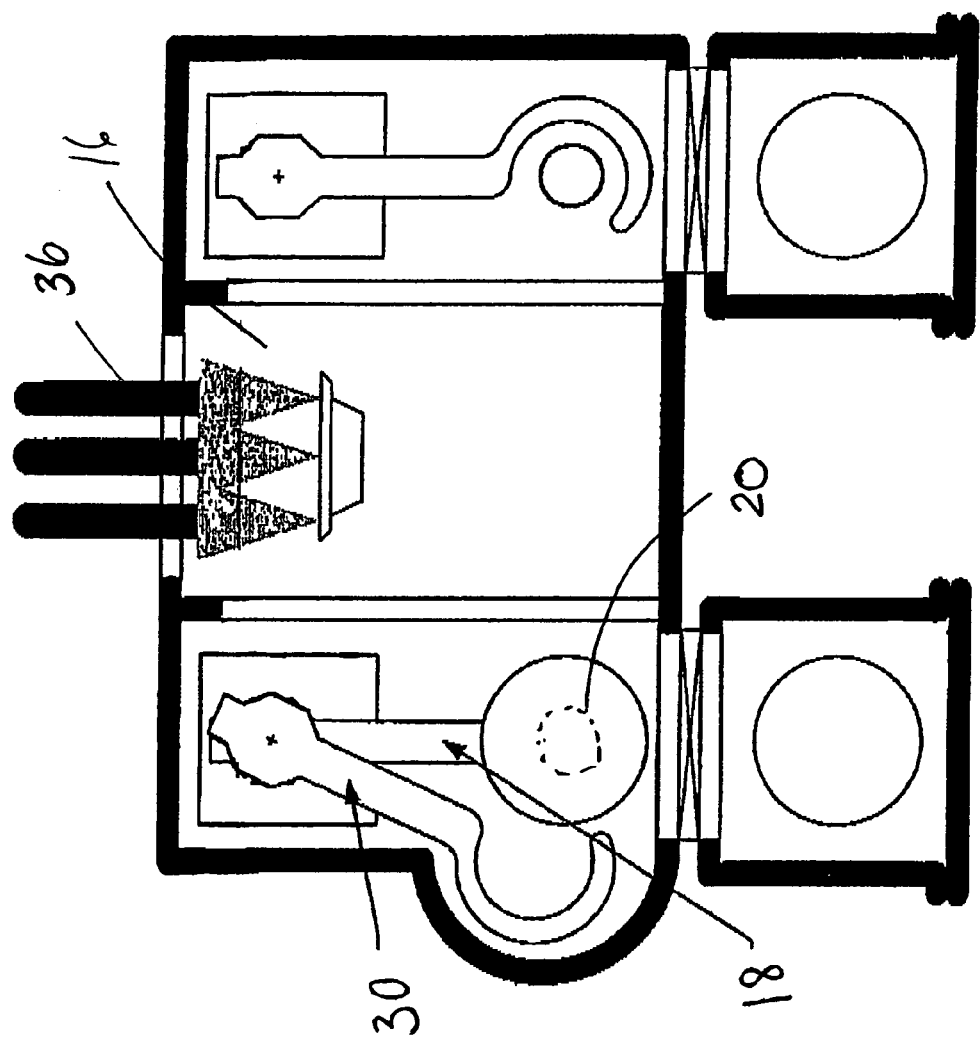
FIG. 6 illustrates the first arm in the orienter position, with the second arm in a standby position.
Figure 7:
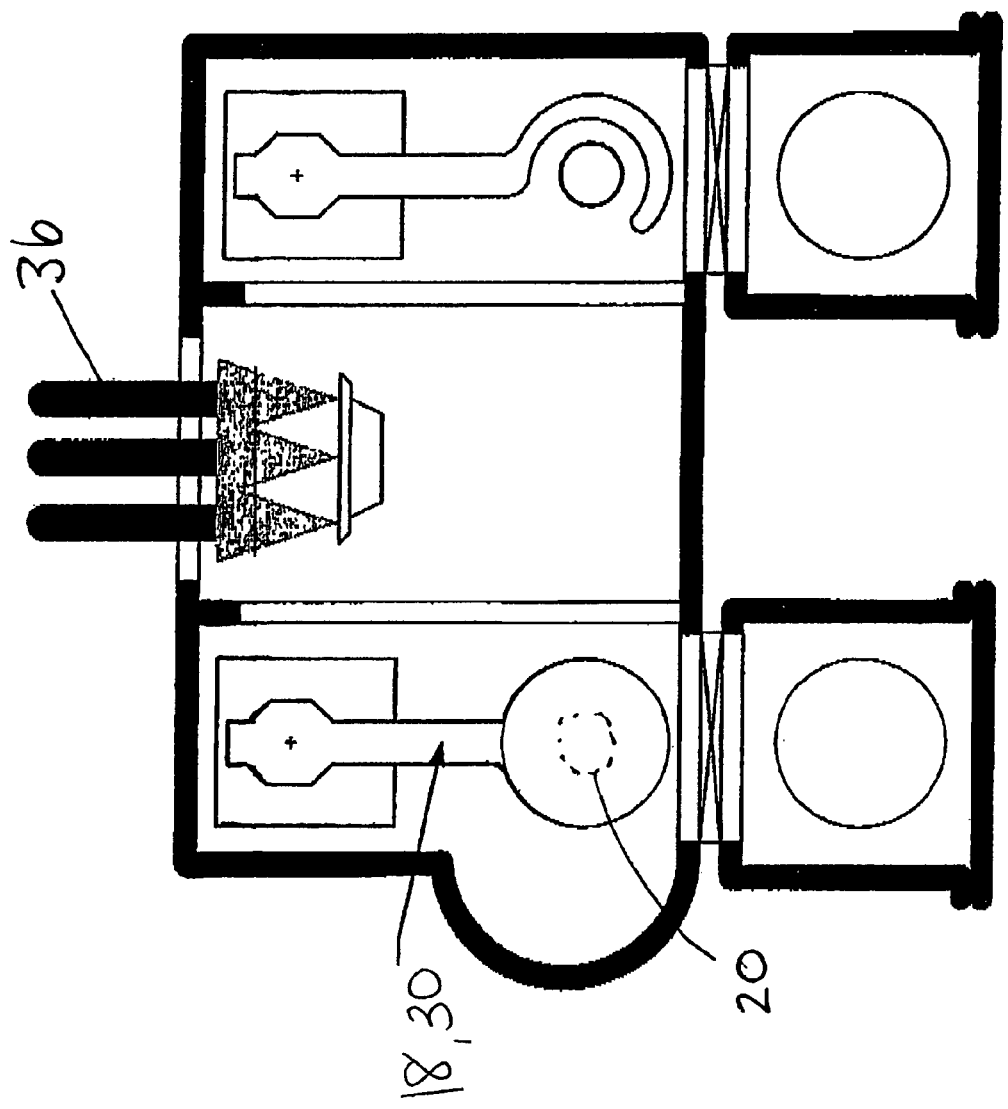
FIG. 7 illustrates the first and second arms in the orienter positions for a delivery of a non-initial wafer for processing.

FIG. 6 indicates the first arm 18 in an orienter position while the second arm 30 resides in an arbitrary standby position. As FIG. 6 also indicates, the first wafer can be processed 36 in the process chamber 16 while the next wafer may be oriented by orienter 20. Further, the second arm 30 may be in an alternate (e.g., orienter) position, as shown in FIG. 7. FIG. 7 also accordingly indicates, similar to FIG. 4, a transfer of the next wafer from the first arm 18 to the second arm 30 where such transfer is facilitated by the orienter 20 as previously provided herein with respect to FIG. 4. Depending on the process system, the first wafer may be processed 30 during such transfer of the second wafer from first arm 18 to second arm 30.

Figure 8:
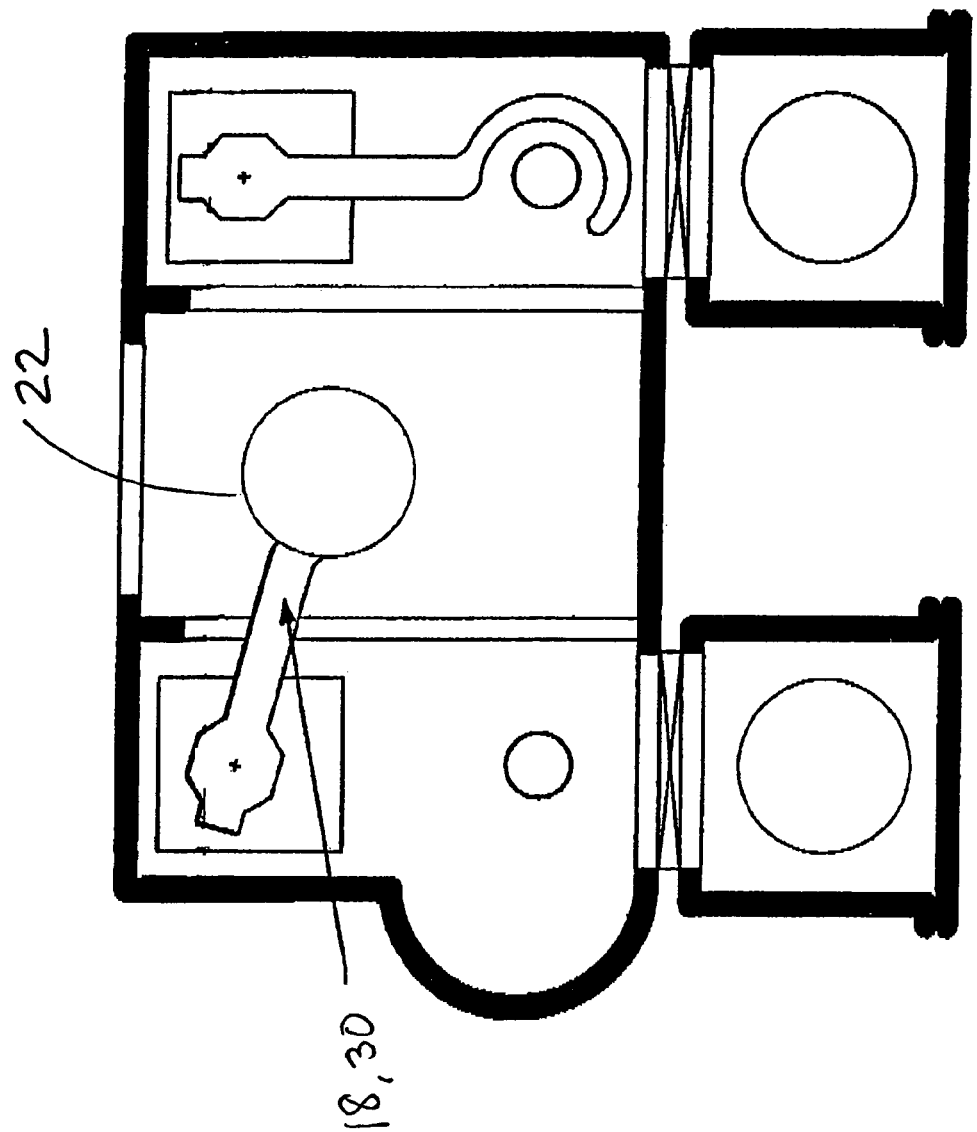
FIG. 8 illustrates the first arm in a platen retrieval position, with the second arm in a process position.

FIG. 8 indicates a movement of the first arm 18 and the second arm 30 to the process position after a transfer of the next wafer to the second arm 30 and after processing of the first wafer (now the "processed" wafer). Although FIG. 8 indicates a simultaneous movement of the first and second arms 18, 30 from an orienter position to a process position, such movement can be non-simultaneous. In a configuration according to FIG. 8, the first or processed wafer can be transferred from and/or by the processing system to the first arm 18 and the next wafer can be delivered to the processing system by the second arm 30. Such first/processed and next wafer transfers between the processing system, first arm 18, and second arm 30 can be coordinated to eliminate interface between the processed and next wafers. Accordingly, for example, in an ion implantation system, a platen 22 can be controlled or otherwise employed to transfer the first wafer to the first arm 18 for removal from processing, while thereafter, the platen 22 can retrieve the next wafer from the second arm 30.

Figure 9:
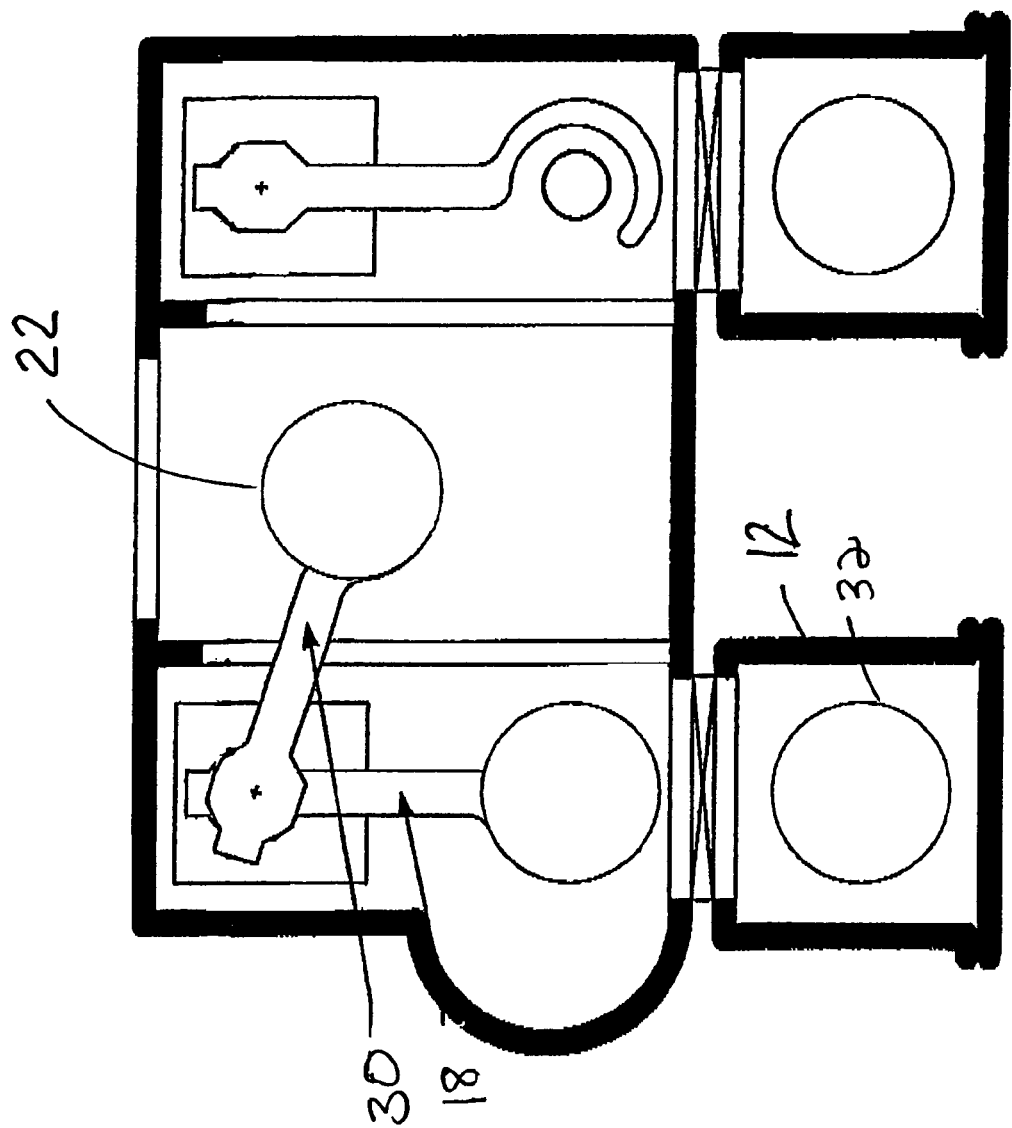
FIG. 9 illustrates the first arm in an orienter position, with the second arm in a process position.
Figure 10:
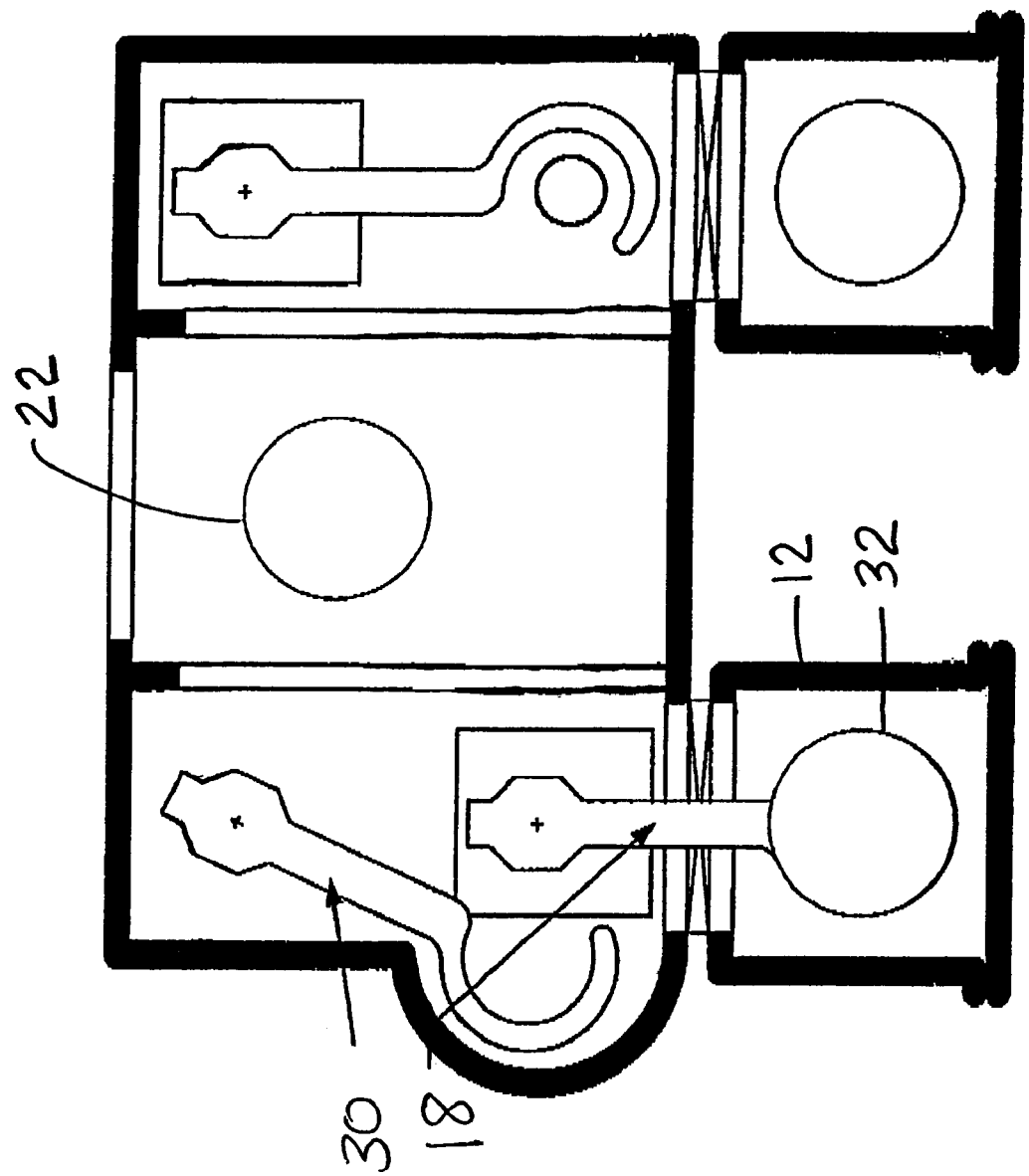
FIG. 10 illustrates the first arm in a load lock delivery position, with the second arm in a standby position.

FIG. 9 indicates that once the platen 22 transfers the first or processed wafer to the first arm 18, the first arm 18 can return to an orienter position while the second arm 30 can remain in the process position to allow the platen 22 to transfer the next wafer from the second arm 30. The first or processed wafer can thus also be returned to the cassette 32 in the left load lock 12, as shown by FIG. 10. Such illustration thus indicates that the cassette 32 can be controlled or indexed to facilitate a return of the first or processed wafer. FIG. 10 also shows that upon delivery of the next wafer to the platen 22, the second arm 30 can return to a standby or other position that is not the process position.

Figure 11:
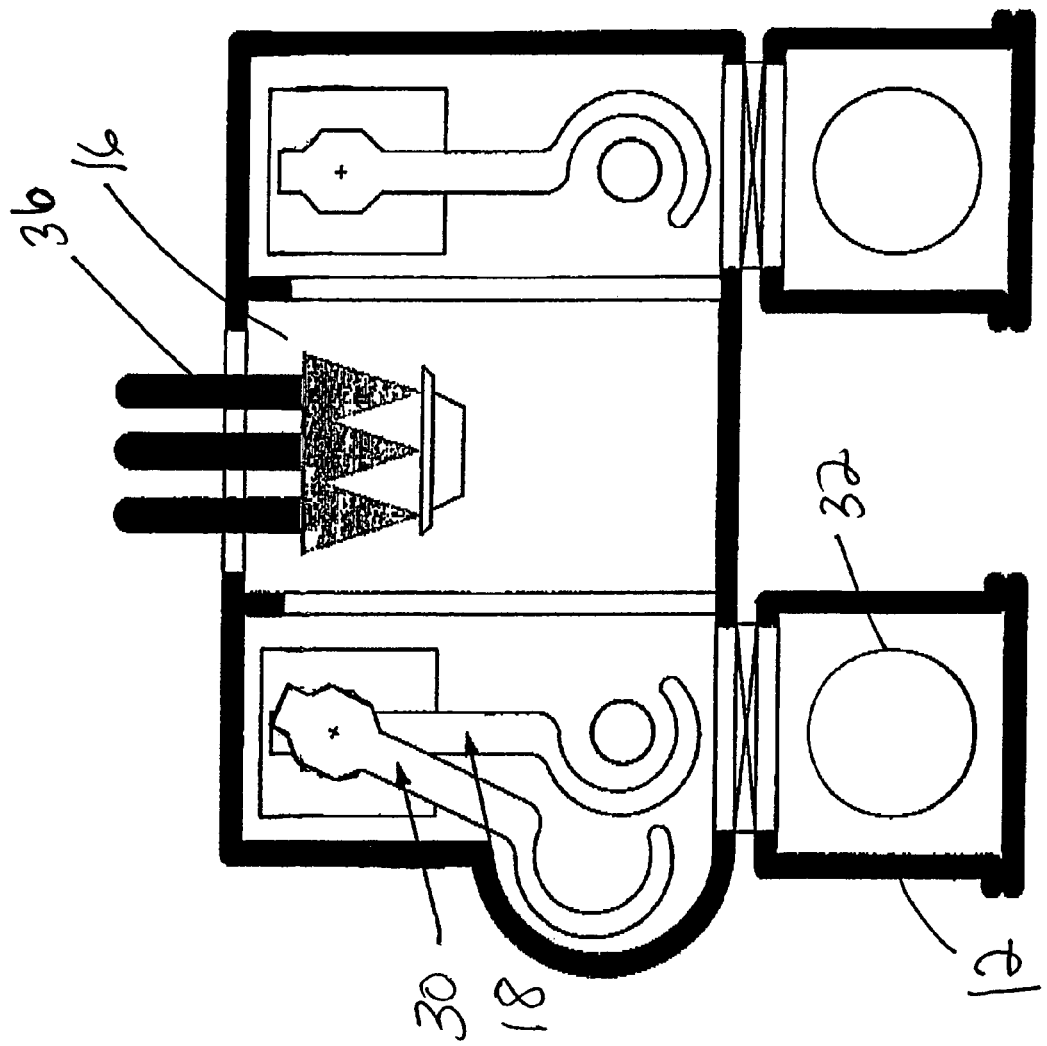
FIG. 11 illustrates the first arm in an orienter position, with the second arm in a standby position.
Figure 12:
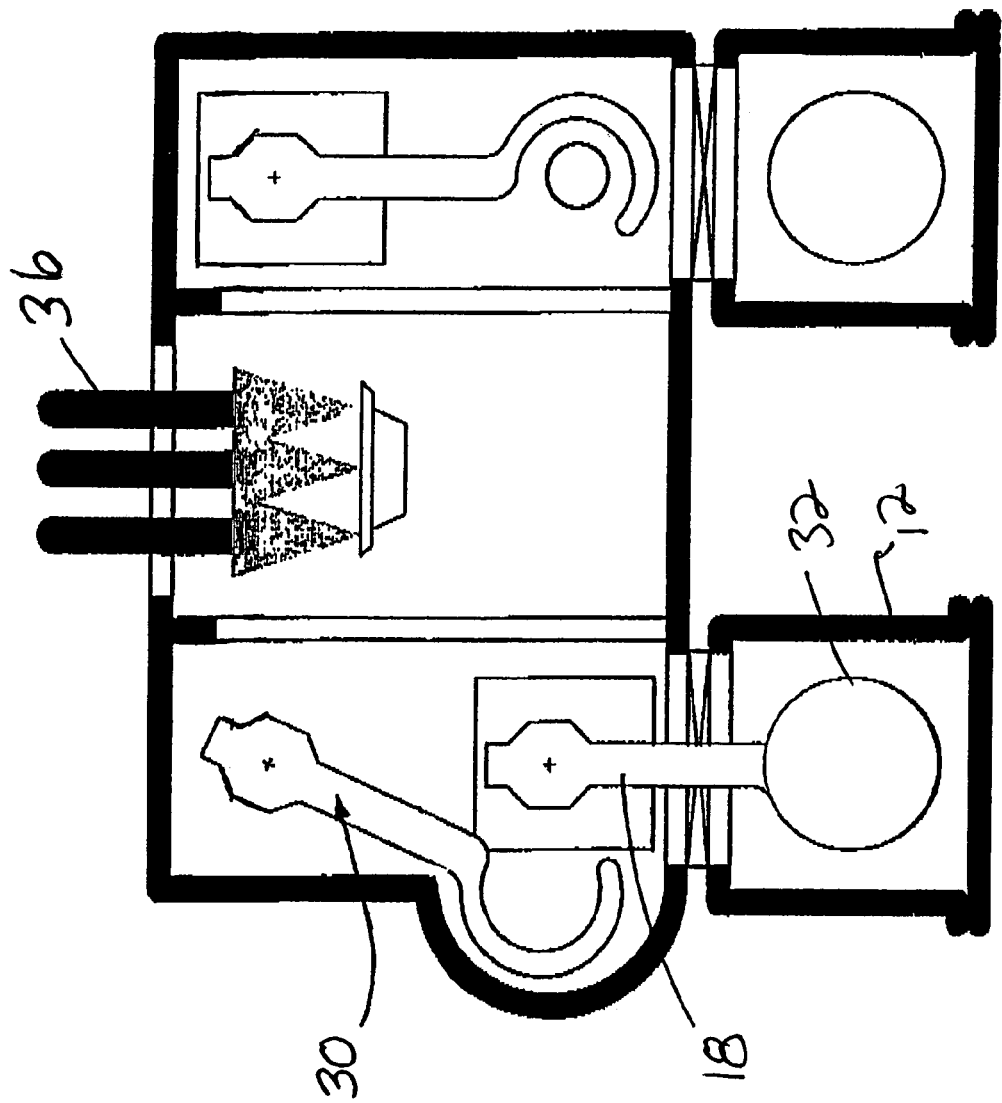
FIG. 12 illustrates the first arm in a load lock retrieval position, with the second arm in a standby position.
Figure 13:
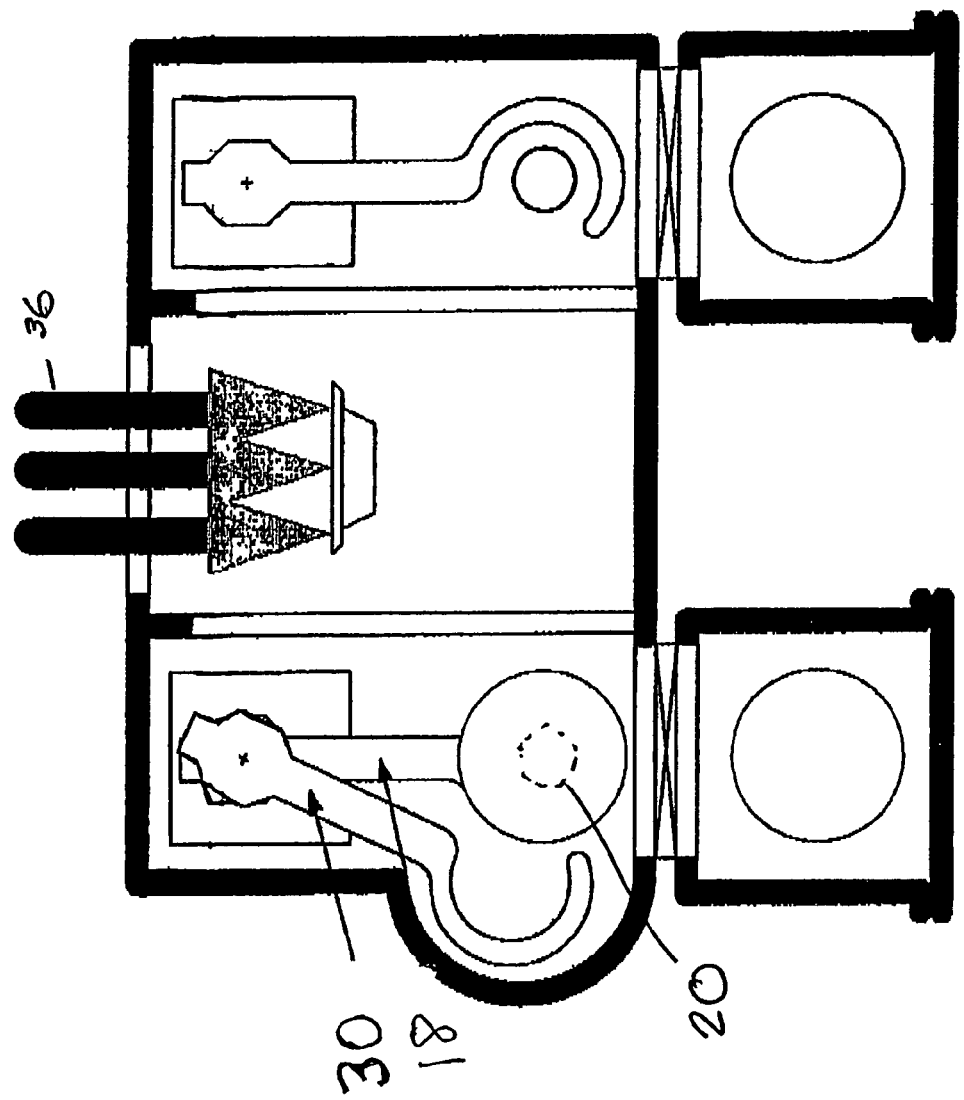
FIG. 13 illustrates the first arm in an orienter position, with the second arm in a standby position.

FIG. 11 illustrates the next wafer being processed 36 in the process chamber 16 while the first arm 18 is in the orienter position, or retracted from the cassette 32, and the second arm 30 is in a standby position. Accordingly, the FIG. 11 cassette 32 can be controlled or indexed to facilitate a third wafer retrieval, which can now be referred to as the "next" wafer, where such retrieval of a third or next wafer by the first arm 18 is illustrated in FIG. 12. Such third or next wafer retrieval from the cassette 32 in the load lock 12 can be performed during processing 36 of the second wafer (which is now the "processed" wafer), where the first arm can return to an orienter position as shown in FIG. 13 to interface the third or next wafer with the orienter 20, and to thereafter facilitate a transfer of the third or next wafer by the orienter 20, where such transfer is from the first arm 18 to the second arm 30 as provided previously herein with respect to FIGS. 4 and 7, and as shown in FIG. 14, where such transfer can occur during processing 36 of the second or processed wafer.

One of ordinary skill will thus recognize that the methods of FIGS. 8 through 14 can be repeated in an iterative manner to sequentially process wafers in the cassette 32 in the left load lock 12, where as provided previously herein, sequential processing does not imply an order of processing. Accordingly, references to the next and processed wafers can continue as wafers are retrieved and processed, with wafers being referred to as the "next" wafer from retrieval from the cassette 32 through a processing 36 in the process chamber 16, whereupon such processing causes the "next" wafer to be referred to as the "processed" wafer.

The methods and systems are thus not specific to a certain wafer retrieval sequence, and such sequence can be based on a given system. Further, some embodiments may not process all wafers in the cassette. Additionally, although the illustrated methods and systems indicate that the first arm 18 was vertically displaced in a certain direction relative to the second arm 30, other embodiments may reverse the configuration. Similarly, other embodiments may provide for non-vertical alignment of arms 18, 30, orienter 20, and/or platen 22.

Figure 14:
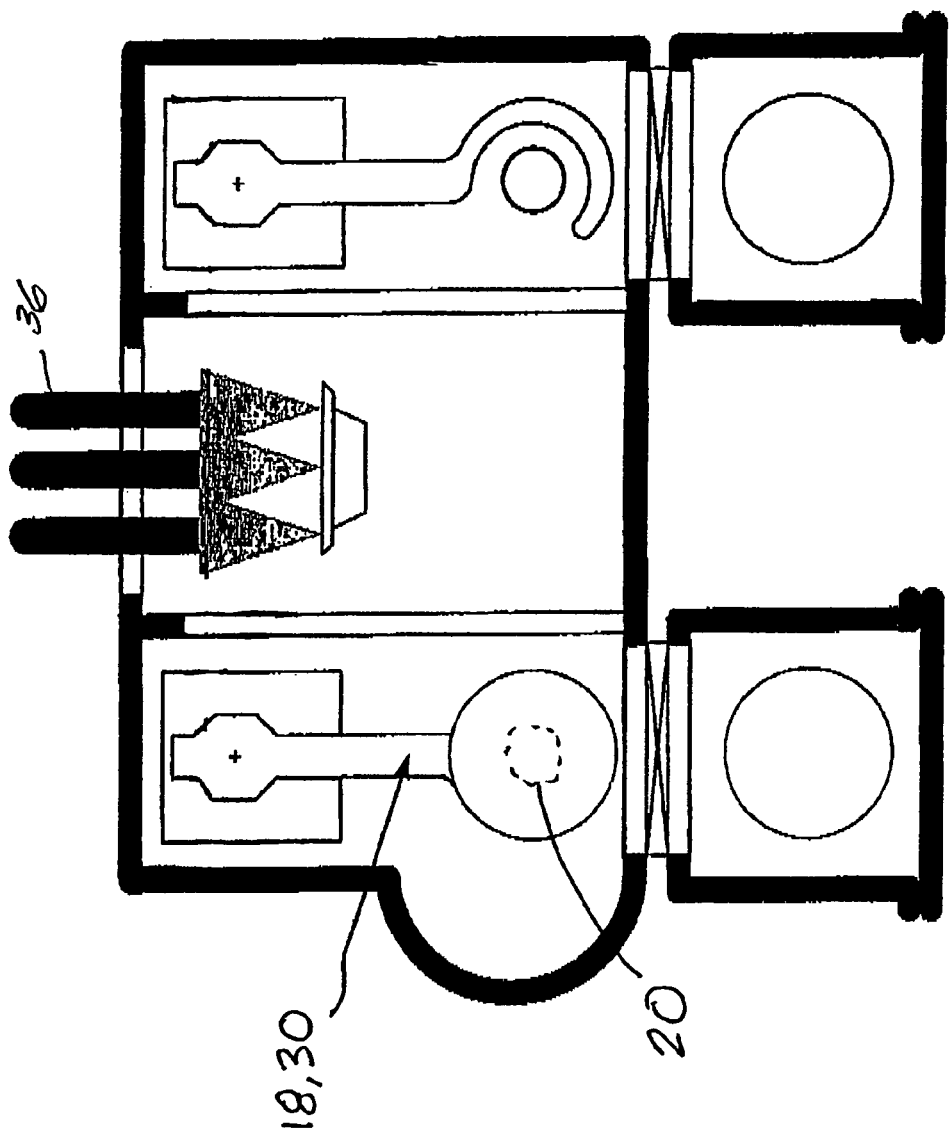
FIG. 14 illustrates the first and second arms in the orienter positions for a delivery of a non-initial wafer for processing.

When a cassette from, for example, the left load lock 12 of FIG. 14, is processed, the methods and systems described herein can be applied to the right load lock 14, and/or another load lock. During a processing of, for example, the right load lock 14 as provided herein with respect to FIGS. 1–14, the left load lock 12 can be isolated from the processing chamber, pressurized in accordance with the loading station, and the cassette 32 can be removed from the load lock 12. Further, a new cassette 32 can be loaded from the loading station to the left load lock 12, the left load lock 12 can be isolated, the left load lock can be evacuated in accordance with the processing chamber 16, and the load lock valve 34 can be opened to facilitate processing of the left load lock cassette 32 upon completion of the right load lock cassette. Accordingly, the methods and systems allow processing of one cassette in a first load lock while another cassette is load lock-processed (e.g., isolated from processing chamber, vented, interchanged, evacuated, valve opened, etc.) in a second load lock.

Further, it can be recognized that while the wafer processing described relative to FIGS. 1–14 was performed on the cassette wafers in the left load lock 12, the right load lock 14 could be performing load lock processing, including for example, isolation from the processing chamber 16, venting the right load lock 12, changing and/or replacing the right load lock cassette, isolating the right load lock 12, evacuating the right load lock 12, opening the load lock valve to expose the right load lock to the processing chamber 16, etc. Also, although not otherwise shown in the illustrations, one of ordinary skill thus can recognize that the methods and systems include first and second arms to process the wafers from the right load lock cassette, where such first and second arms can be the same as or different from the first and second arms 18, 30 for processing the left load lock cassette.

Accordingly, some embodiments can use a single set of first and second arms 18, 30 to access and/or process different load locks, while some embodiments may associate different first and second arms for processing different load locks.

FIG. 15 provides one illustration of a disclosed system and method. As shown in FIG. 15, a first wafer can be retrieved from a cassette by the first arm 100, oriented 102, transferred to the second arm 104, and delivered for processing using the second arm 106. While the first wafer is being processed 108, a second or "next" wafer can be retrieved from the cassette using the first arm 110, oriented 112, and transferred to the second arm 114. The first wafer, now the processed wafer, can be removed from processing using the first arm 116 to allow the second arm to deliver the next wafer for processing 118. While the next wafer is processed 120, the processed wafer can be returned to the cassette using the first arm 122, and based on whether unprocessed wafers remain in the cassette 124, the first arm can retrieve a "next" wafer from the cassette 126, orient the next wafer 112, and transfer the next wafer from the first arm to the second arm 114. Such processing can continue according to FIG. 15 until a desired number of wafers in the cassette are processed 124. When the cassette does not include wafers for which processing is desired 124, a next load lock that includes a cassette of at least one unprocessed wafer can be selected 128, and processing 100 can continue on such next load lock cassette as provided in FIG. 15. Further, load lock processing can be performed 130 on the load lock that contains the processed wafers, where such load lock processing can include isolating the load lock, venting, removing a cassette, replacing a cassette, inserting a cassette, evacuating the load lock, open the load lock valve, etc. Accordingly, those of ordinary skill will recognize that load lock processing can be performed on one or more load locks while wafer processing can be performed on another load lock. Further, it can be understood herein that the methods and systems illustrated by FIG. 15 can be performed in parallel, for example, as wafer processing 108 and 120 can be performed in parallel with next wafer retrieval, orienting, and transferral 110–114 and 122–114, respectively.

Those of ordinary skill will also recognize that although the methods and systems presented an embodiment where during processing of a processed wafer, a next wafer is retrieved, oriented, and transferred from the first arm to the second arm, some methods and systems may include shorter processing times such that processing may not coincide completely with retrieval, orienting, and transferral. Accordingly, in some embodiments, processing may complete before retrieval, orienting, and transferral 110, 112, 114, while in other embodiments, processing may not complete until after retrieval, orienting, and transferral 110, 112, 114, and thus may indicate a delay until removal 116 and/or a measurement or other means to indicate when processing is complete.

Figure 16A:
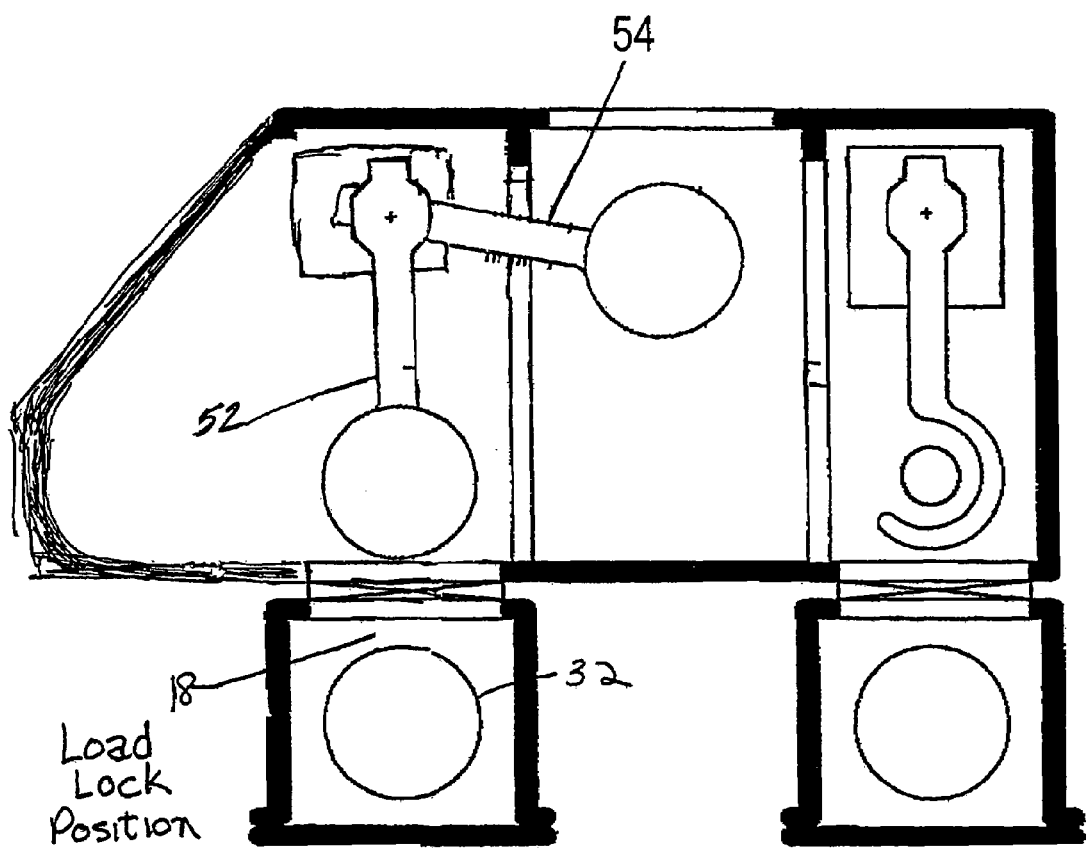
FIGS. 16A–16C illustrate an embodiment of a system that includes a first and second arm for handling wafers.
Figure 16B:
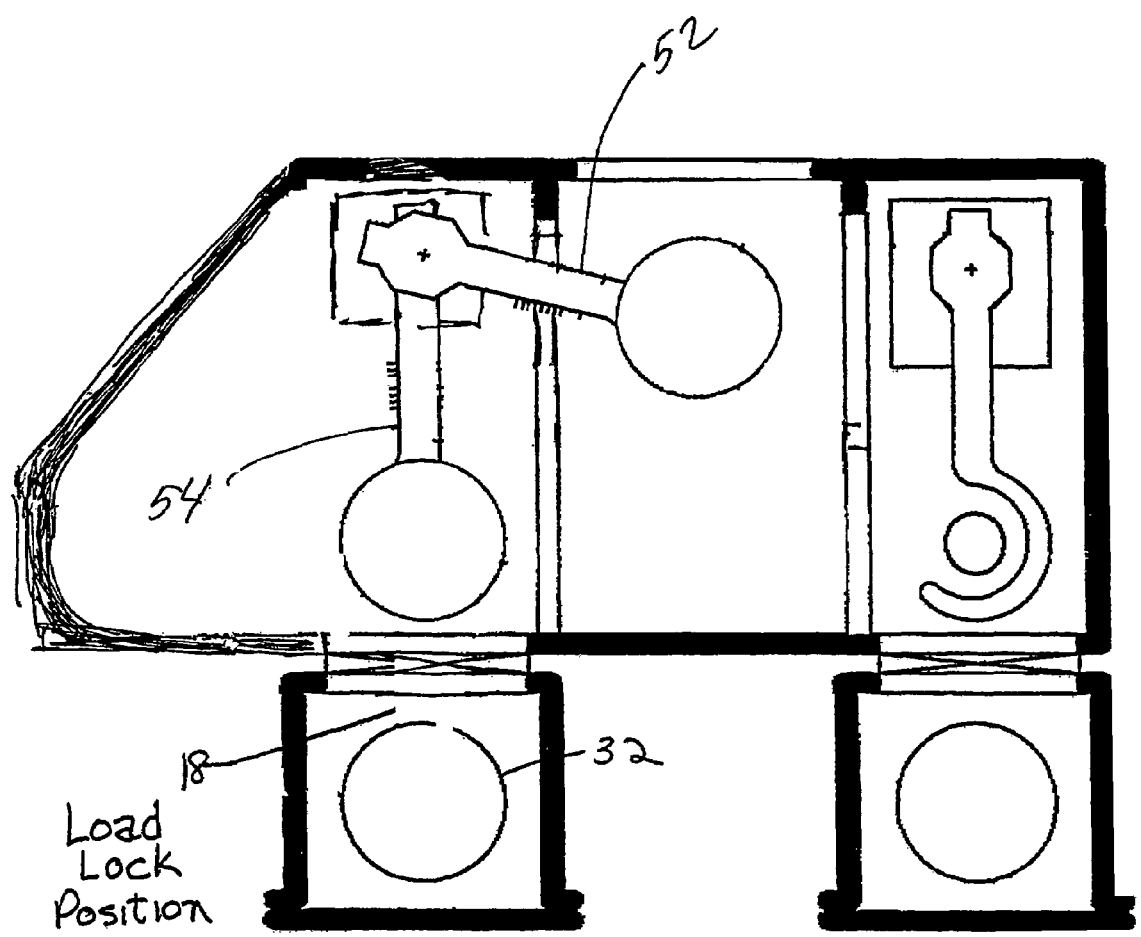
Figure 16C:
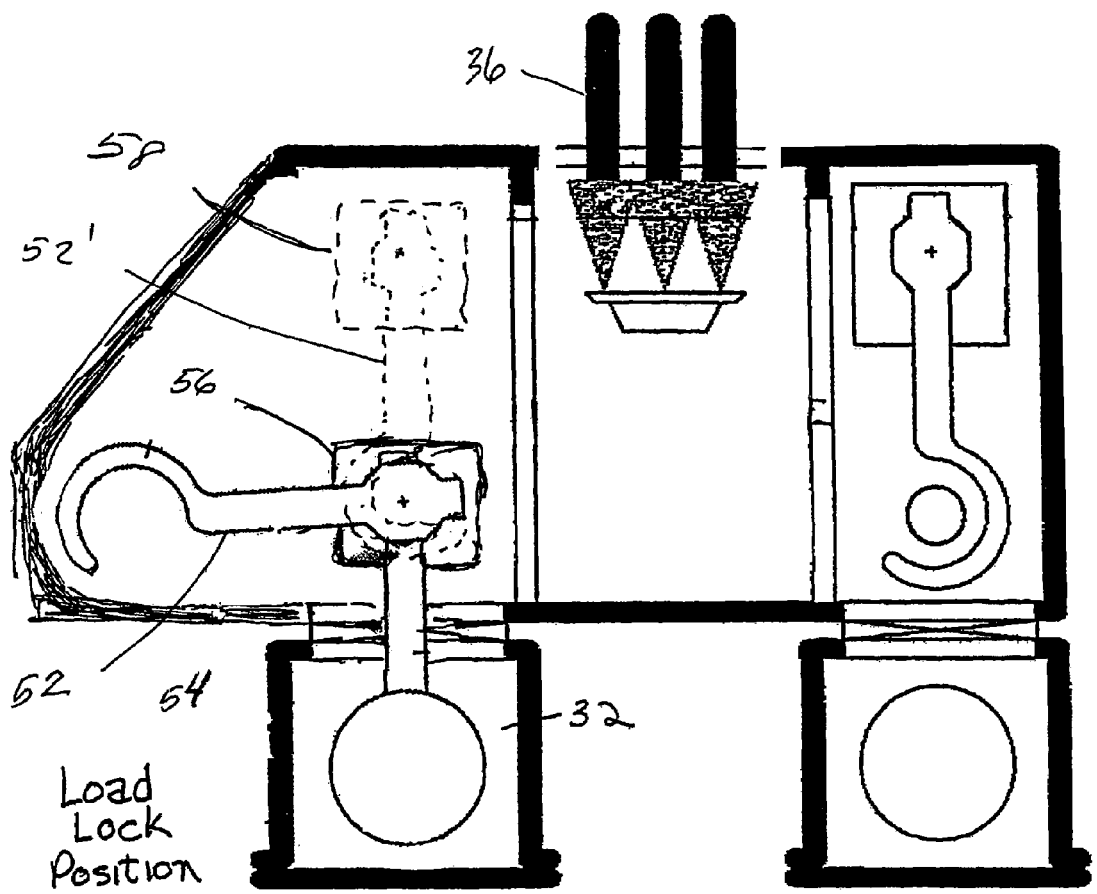

FIGS. 16A–16C, show a schematic representation of another embodiment according to the disclosed methods and systems for handling wafers. FIGS. 16A–16C show portions of a wafer processing system that includes a left load lock 12 and right load lock 14. As previously provided herein, the methods and systems will be described relative to the left load lock 12 with the understanding that the methods and systems can be applied to the right load lock 14. The FIGS. 16A–16D illustrate positions that may be engaged by a first arm 52 and a second arm 54 that can access the left load lock 12. As will be provided herein, the first and second arms 52, 54 can be positioned in positions that include at least a load lock position to allow the first and second arms 52, 54 to retrieve and/or return a wafer from/to the cassette 32 in the left load lock 12, an orienter position to allow the first and second arms 52, 54 to interface with at least an orienter 20, and a process position to allow the first and second arms 52, 54 to place a wafer in and/or retrieve a wafer from a process chamber 16.

FIG. 16A can illustrate a first arm 52 in the orienter position to allow the retrieved wafer to be oriented for processing. Those of ordinary skill in the art will recognize that the orienter 20 can be controlled or otherwise operated in the illustrated systems to allow for the orienter 20 to be vertically aligned with the first and second arms 52, 54 when the first and second arms 52, 54 are in the orienter position, and accordingly, the orienter 20 can be adjusted as needed to interface with the first and second arms 52, 54 to allow orientation of the wafer. At such time as the first arm 52 is in the orienter position, the second arm 54 may be in the process position to retrieve a processed wafer from platen 22.

Referring to FIG. 16B, first arm 52 can rotate to the process position to load the retrieved wafer onto platen 22. Second arm 54 can rotate to the orienter position. It can be understood that clearance between first and second arms 52, 54 can be arranged to allow a distance that facilitates independent operation when vertically aligned, while recognizing that a reduced vertical distance between the first and second arms 52, 54 may reduce processing time to transfer wafers between the first and second arms 52, 54 and the orienter 20 and the platen 22, as well as time to index wafer cassette 32. Although such vertical distance between such arms 52, 54 can thus vary based on system characteristics, in one embodiment, when vertically aligned, the first and second arms 52, 54 can be separated by less than approximately five-eights to one-half of one inch.

Once the retrieved wafer is loaded onto platen 22, first arm 52 can return to the orienter position, or to a standby position such that the retrieved wafer can be processed 36, as previously described, while the second arm 54 can return the processed wafer to the wafer cassette 32, as illustrated in FIG. 16C. As previously described, one of ordinary skill may recognize that the chamber 16 is shown to be enlarged to accommodate the first arm 52, which may be understood to be illustrated in one of the aforementioned standby positions. It can be understood that such enlargement of the process chamber 16 is optional, and in some embodiments, such enlargement may not be necessary to accommodate one or more standby positions for the first and second arms 52, 54.

In one embodiment, shown in FIG. 16C, first and second arms 52, 54 can be mounted on or otherwise connected to a carriage 56 that can facilitate movement of first and second arms 52, 54 into and out of load lock 12 for return and retrieval of wafers to and from wafer cassette 32. In other embodiments, the second arm 54 can be mounted to or otherwise connected to carriage 56 and the first arm 52 can be mounted on or otherwise connected to a second carriage 58, as shown in phantom in FIG. 16C, with carriages 56, 58 being configured for separate movement of the first and second arms 52, 54. In such embodiments, the standby position for the first arm 52 can include the orienter position, as indicated in phantom as 52' in FIG. 16C, while the second arm 54 can return the wafer to wafer cassette 32, though it can be understood that other of the aforementioned standby positions can be utilized. Wafer cassette 32 can be indexed, such that second arm 54 can retrieve a next wafer for processing.

The process can be repeated, as described further below with respect to FIG. 17, with the positions of the first and second arms 52, 54 being alternated in the FIGS. 16A–16C.

Figure 17:
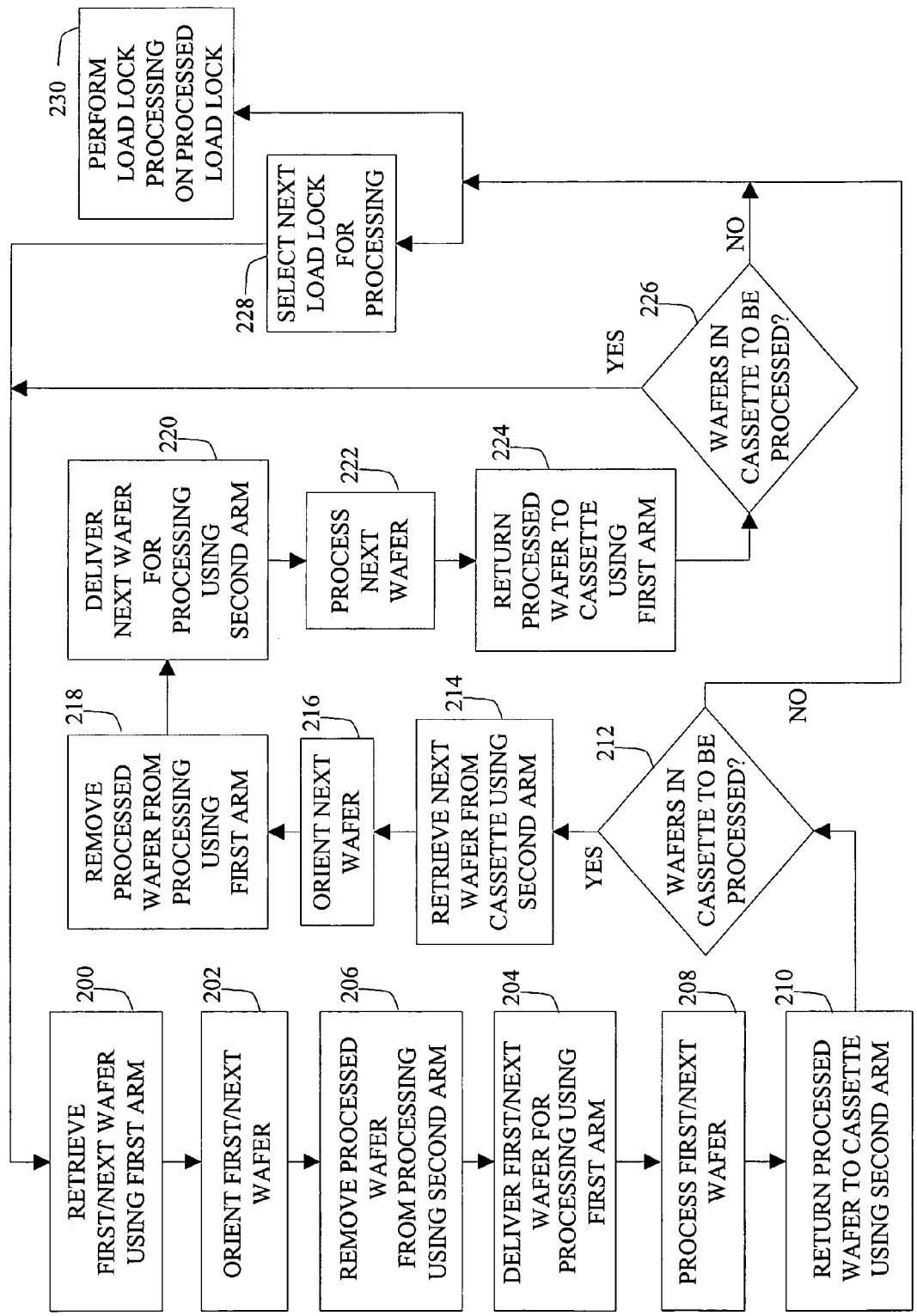
FIG. 17 illustrates a block diagram for another disclosed system and method; and, FIG. 18 illustrates a prior art system.
Figure 18:
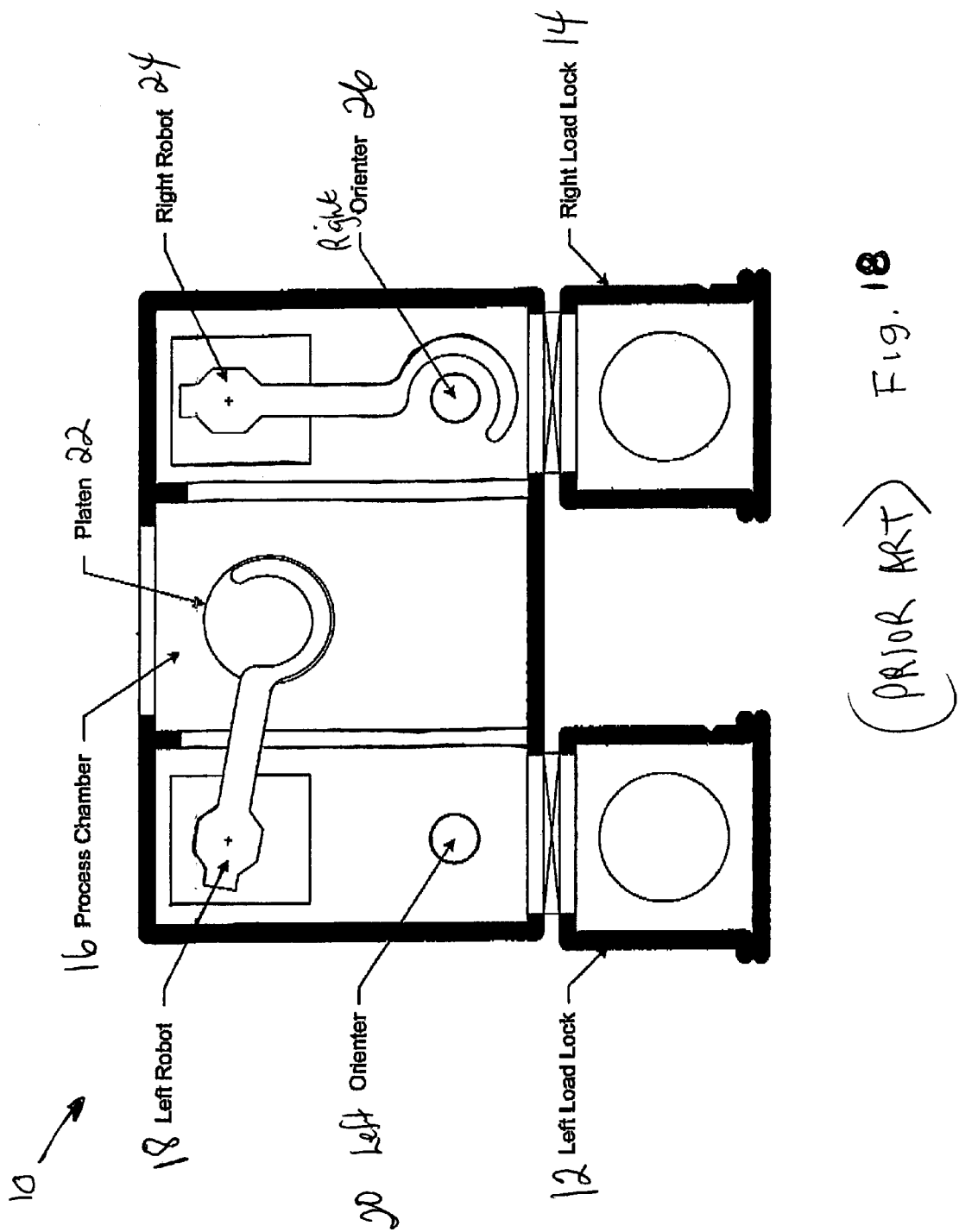

As shown in FIG. 17, a first wafer can be retrieved from a cassette by the first arm 200, oriented 202, and delivered for processing using the first arm 204. While this wafer is being oriented, a second or processed wafer can be removed from processing using the second arm 206. The first arm can deliver the first wafer for processing 208, while the second arm returns the next wafer to the cassette 210. Based on whether unprocessed wafers remain in the cassette 212, the second arm can retrieve a "next" wafer from the cassette 214 for orientation of the "next" wafer 216, while the first wafer is processing. The first wafer, now the processed wafer, can be removed from processing using the first arm 218 to allow the second arm to deliver the next wafer for processing 220. While the next wafer is processed 222, the processed wafer can be returned to the cassette using the first arm 224, and based on whether unprocessed wafers remain in the cassette 226, the first arm can retrieve a "next" wafer from the cassette 200, orient the next wafer 202, and deliver the next wafer for processing 204. Such processing can continue according to FIG. 17 until a desired number of wafers in the cassette are processed 212. When the cassette does not include wafers for which processing is desired 212, a next load lock that includes a cassette of at least one unprocessed wafer can be selected 228, and processing 200 can continue on such next load lock cassette as provided in FIG. 17. Further, load lock processing can be performed 230 on the load lock that contains the processed wafers, where such load lock processing can include isolating the load lock, venting, removing a cassette, replacing a cassette, inserting a cassette, evacuating the load lock, open the load lock valve, etc. Accordingly, those of ordinary skill will recognize that load lock processing can be performed on one or more load locks while wafer processing can be performed on another load lock. Further, it can be understood herein that the methods and systems illustrated by FIG. 17 can be performed in parallel, for example, as wafer processing 208 and 222 can be performed in parallel with return of a processed wafer to the cassette, next wafer retrieval and orienting, 210–216 and 224, 200–204, respectively.

Those of ordinary skill will also recognize that although the methods and systems presented an embodiment where during processing of a processed wafer, a processed wafer is returned, and a next wafer is retrieved and oriented, some methods and systems may include shorter processing times such that processing may not coincide completely with return, retrieval, and orienting. Accordingly, in some embodiments, processing may complete before return, retrieval, and orienting, 210, 114, 216, while in other embodiments, processing may not complete until after return, retrieval, and orienting, 210, 214, 216, and thus may indicate a delay until removal 218 and/or a measurement or other means to indicate when processing is complete.

What has thus been described are systems and methods for handling wafers that include retrieving a first wafer from a wafer cassette using a first arm, transferring the first wafer from the first transfer arm to a second arm, delivering the first wafer for processing to a process chamber using the second arm, removing the first wafer from the process chamber using the first arm, and, returning the first wafer to the cassette using the first arm.

The methods and systems described herein are not limited to a particular hardware or software configuration, and may find applicability in many computing or processing environments. For example, the control of the cassette interchanges, evacuation and venting, load lock valves, orienters, processing systems (e.g., platen, ion implantation, etc.), and the arms, can be implemented in hardware or software, or a combination of hardware and software. The methods and systems can be implemented in one or more computer programs, where a computer program can be understood to include one or more processor executable instructions. The computer program(s) can execute on one or more programmable processors, and can be stored on one or more storage medium readable by the processor (including volatile and non-volatile memory and/or storage elements), one or more input devices, and/or one or more output devices. The processor thus can access one or more input devices to obtain input data, and can access one or more output devices to communicate output data. The input and/or output devices can include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processor as provided herein, where such aforementioned examples are not exhaustive, and are for illustration and not limitation.

The computer program(s) is preferably implemented using one or more high level procedural or object-oriented programming languages to communicate with a computer system; however, the program(s) can be implemented in assembly or machine language, if desired. The language can be compiled or interpreted.

As provided herein, the processor(s) can thus be embedded in one or more devices that can be operated independently or together in a networked environment, where the network can include, for example, a Local Area Network (LAN), wide area network (WAN), and/or can include an intranet and/or the Internet and/or another network. The network(s) can be wired or wireless or a combination thereof and can use one or more communications protocols to facilitate communications between the different processors. The processors can be configured for distributed processing and can utilize, in some embodiments, a client-server model as needed. Accordingly, the methods and systems can utilize multiple processors and/or processor devices, and the processor instructions can be divided amongst such single or multiple processor/devices.

The device(s) or computer systems that integrate with the processor(s) can include, for example, a personal computer(s), workstation (e.g., Sun, HP), personal digital assistant (PDA), handheld device such as cellular telephone, laptop, handheld, or another device capable of being integrated with a processor(s) that can operate as provided herein. Accordingly, the devices provided herein are not exhaustive and are provided for illustration and not limitation.

References to "a processor" or "the processor" can be understood to include one or more processors that can communicate in a stand-alone and/or a distributed environment(s), and can thus can be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network using a variety of communications protocols, and unless otherwise specified, can be arranged to include a combination of external and internal memory devices, where such memory can be contiguous and/or partitioned based on the application. Accordingly, references to a database can be understood to include one or more memory associations, where such references can include commercially available database products (e.g., SQL, Informix, Oracle) and also proprietary databases, and may also include other structures for associating memory such as links, queues, graphs, trees, with such structures provided for illustration and not limitation.

References to a network, unless provided otherwise, can include one or more intranets and/or the Internet.

Many additional changes in the details, materials, and arrangement of parts, herein described and illustrated, can be made by those skilled in the art. Accordingly, it will be understood that the following claims are not to be limited to the embodiments disclosed herein, can include practices otherwise than specifically described, and are to be interpreted as broadly as allowed under the law.

What is claimed is:

1. A method for handling wafers, the method comprising:
   extending a first arm from a first position for retrieving a first wafer from a storage position,
   returning the first arm to the first position,
   transferring the first wafer from the first arm to a second arm at the first position,
   rotating the second arm about an axis for delivering the first wafer to a processing position for processing to generate a processed wafer,
   rotating the first arm about the axis for removing the processed wafer from the processing position,
   rotating the first arm about the axis return the first arm to the first position, and,
   extending the first arm from the first position for returning the processed wafer to the storage position.

2. A method according to claim 1, where delivering includes delivering while extending the first arm from the first position for retrieving a next wafer from the storage position.

3. A method according to claim 2, where the storage position is in a wafer cassette and retrieving includes indexing the cassette.

4. A method according to claim 1, further including processing the first wafer in a process chamber.

5. A method according to claim 4, where processing includes performing at least one of: photoresist, dry etch, ion implantation, chemical deposition, and diffusion.

6. A method according to claim 5, where processing includes at least one of orienting the next wafer and transferring the next wafer from the first arm to the second arm.

7. A method according to claim 1, where the storage position is in a wafer cassette and retrieving includes Indexing the cassette.

8. A method according to claim 1 where the storage position is in a wafer cassette and returning the processed wafer to the cassette includes indexing the cassette.

9. A method according to claim 1, further including orienting the first wafer prior to transferring the first wafer.

10. A method according to claim 1, where returning the processed wafer to the storage position includes retrieving a next wafer.

11. A method according to claim 10, where returning the processed wafer to the storage position includes rotating the second arm to a standby position.

12. A method according to claim 1, where transferring includes aligning the first arm and the second arm to facilitate the transfer of the first wafer from the first arm to the second arm.

13. A method according to claim 1, where transferring includes:
   controlling an orienter to lift the first wafer from the first arm,
   rotating the second arm from a standby position to the first position, and,
   controlling the orienter to lower the first wafer onto the second arm.

14. A method for handling wafers, the method comprising:
- retrieving a first wafer from a wafer cassette using a first arm,
- lifting the first wafer from the first arm,
- rotating a second arm about an axis from a standby position to a position aligned with the, flint arm,
- lowering the first wafer onto the second arm far transferring the first wafer from the first arm to the second arm,
- delivering the first wafer for processing by rotating the second arm about the axis to a processing position while retrieving a distinct next wafer from the wafer cassette using the first arm,
- processing the first wafer to generate a processed wafer, while transferring the next wafer from the first arm to the second arm,
- removing the processed wafer from processing by rotating the first arm about the axis to the processing position, and,
- delivering the next wafer for processing using the second arm while returning the processed wafer to the cassette using the first arm.

15. A method according to claim 14, further including retrieving a distinct next wafer from the cassette using the first arm while processing the next wafer, and iteratively performing the processing, removing, and delivering.

16. A method according to claim 14, where processing includes performing at least one of: photoresist, dry etch, ion implantation, chemical deposition, and diffusion.

17. A method according to claim 14, where transferring includes controlling an orienter to orient the first wafer for processing between lifting the first wafer from the first arm and lowering the first wafer onto the second arm.

18. A method according to claim 14, where retrieving includes indexing the cassette.

19. A method for handling wafers, the method comprising:
- retrieving a next wafer from a selected cassette using a first arm,
- transferring the next wafer to a second arm at a transfer position,
- rotating the first and second arms about a common axis from the transfer position to a processing position,
- removing a processed wafer from a process system at the processing position using the first arm,
- delivering the next wafer to the process system using the second arm, and,
- returning the processed wafer to the selected cassette using the first arm.

20. A method according to claim 19, further including iteratively returning to retrieving, wherein:
- returning comprises rotating the first arm about the axis to the transfer position and rotating the second arm about the axis to a standby position, and,
- transferring comprises rotating the second arm to the transfer position.

21. A method according to claim 19, where transferring includes using an orienter to transfer the next wafer.

22. A method according to claim 19, further including orienting the processed wafer before returning.

23. A method according to claim 19, further including selecting a cassette prior to retrieving.

24. A method according to claim 19, further including determining whether unprocessed wafers remain in the selected cassette.

25. A method according to claim 24, including when no unprocessed wafers remain in the selected cassette, performing at least one of: load lock processing associated with the selected cassette, and selecting a next cassette and iteratively returning to retrieving.

26. A method for handling wafers, the method comprising
- retrieving a next wafer from a storage position using a first arm,
- removing a processed wafer from processing using a second arm,
- delivering the next wafer for processing using the first arm,
- returning the processed wafer to the storage position using the second arm, and
- iteratively performing the retrieving, removing, delivering and returning while alternating using the first arm and the second arm between iterations.

27. A method according to claim 26, where returning includes returning while processing the next wafer in a process chamber.

28. A method according to claim 27, where processing includes performing at least one of: photoresist, dry etch, ion implantation, chemical deposition, and diffusion.

29. A method according to claim 26, further including orienting the next wafer prior to delivering the next wafer.

30. A method according to claim 26, where the storage position is in a wafer cassette and retrieving includes indexing the cassette.

31. A method according to claim 26, where the storage position is in a wafer cassette and returning the processed wafer to the cassette includes indexing the cassette.

32. A method according to claim 26, where returning the processed wafer to the storage position using the second arm includes placing the first arm in a standby position.

33. A method for handling wafers, the method comprising:
- retrieving a first wafer from a wafer cassette using a first arm while removing a processed wafer from processing using a second arm,
- delivering the first wafer for processing,
- returning the processed wafer to the wafer cassette while processing the first wafer to generate a processed wafer,
- retrieving a next wafer from the wafer cassette using the second arm while removing the processed wafer from processing rising the first arm,
- delivering the next wafer for processing,
- returning the processed wafer to the wafer cassette while processing the next wafer to generate a next processed wafer, and
- iteratively performing the retrieving, delivering and returning while alternating using the first arm and the second arm between iterations.

34. A method according to claim 33, further including orienting the first wafer prior to delivering the first wafer, and orienting the next wafer prior to delivering the next wafer.

35. A method according to claim 33, wherein retrieving includes indexing the cassette.

36. A method according to claim 33, where delivering the first wafer includes processing the first wafer in a process chamber, and delivering the next wafer includes processing the next wafer in a process chamber.

37. A method according to claim 36, where processing includes performing at least one of: photoresist, dry etch, ion implantation, chemical deposition, and diffusion.

* * * * *